US007187411B2

(12) United States Patent
Yamada

(10) Patent No.: US 7,187,411 B2
(45) Date of Patent: Mar. 6, 2007

(54) CHARGE TRANSFER DEVICE HAVING DISCHARGE DRAIN, CCD IMAGE SENSOR, AND CCD IMAGE PICKUP SYSTEM

(75) Inventor: Tetsuo Yamada, Miyagi (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 779 days.

(21) Appl. No.: 09/968,995

(22) Filed: Oct. 3, 2001

(65) Prior Publication Data

US 2002/0039144 A1    Apr. 4, 2002

(30) Foreign Application Priority Data

Oct. 4, 2000    (JP)    ............................. 2000-304290

(51) Int. Cl.
*H04N 5/335*    (2006.01)
*H01L 27/148*    (2006.01)
*H01L 21/00*    (2006.01)

(52) U.S. Cl. .................... 348/314; 348/294; 257/230

(58) Field of Classification Search ................ 348/394, 348/311–316, 294; 257/225–232; 438/60, 438/75–81; 250/208.1, 370.08
See application file for complete search history.

(56) References Cited

U.S. PATENT DOCUMENTS 5,514,887 A    5/1996    Hokari

| | | | |
|---|---|---|---|
| 5,589,698 A * | 12/1996 | Nakashiba | 257/231 |
| 5,744,831 A | 4/1998 | Tanaka | |
| 5,796,432 A * | 8/1998 | Iesaka et al. | 348/311 |
| 6,215,521 B1 * | 4/2001 | Surisawa et al. | 348/314 |
| 6,400,404 B2 * | 6/2002 | Hirota et al. | 348/314 |
| 6,573,935 B1 * | 6/2003 | Yamada | 348/272 |
| 6,686,962 B1 * | 2/2004 | Miyahara | 348/311 |
| 6,707,498 B1 * | 3/2004 | Toma et al. | 348/311 |
| 7,050,101 B2 * | 5/2006 | Wako et al. | 348/314 |

FOREIGN PATENT DOCUMENTS

| EP | 0 732 748 A2 | 9/1996 |
|---|---|---|
| EP | 1 091 412 A2 | 4/2001 |
| JP | 2000-152093 | 5/2000 |

\* cited by examiner

*Primary Examiner*—Vivek Srivastava
*Assistant Examiner*—Kelly Jerabek
(74) *Attorney, Agent, or Firm*—Arent Fox LLP

(57) ABSTRACT

In a CCD image sensor, a CCD line memory is disposed between each vertical charge transfer device and a horizontal charge transfer device to selectively transfer charges from each vertical charge transfer device to the horizontal charge transfer device. A discharge drain is disposed along the horizontal charge transfer device to selectively discharge charges from vertical charge transfer devices via the horizontal charge transfer device to the discharge drain. Therefore, image data in which the numbers respectively of the vertical and horizontal pixels are reduced can be generated.

24 Claims, 18 Drawing Sheets

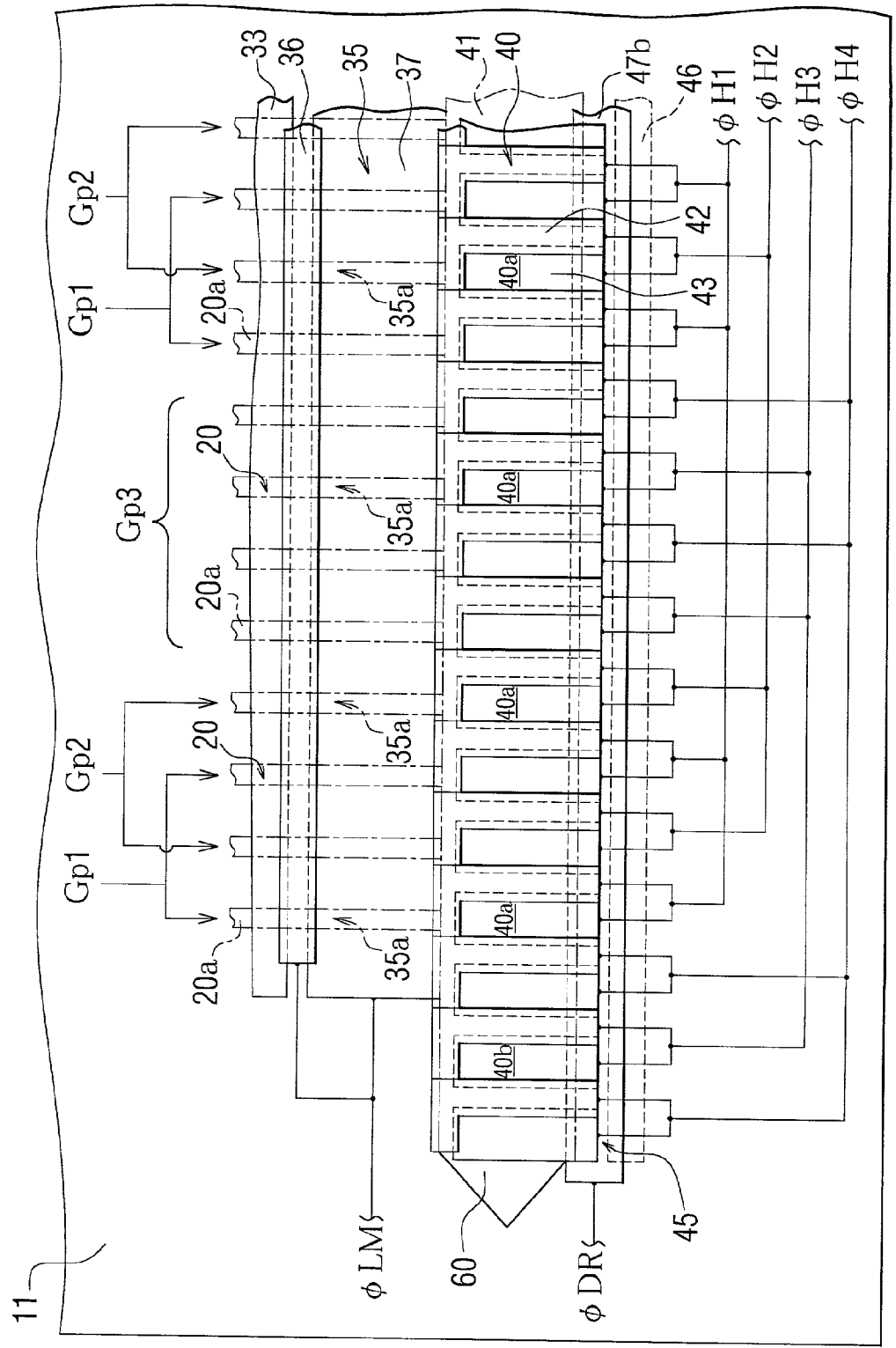

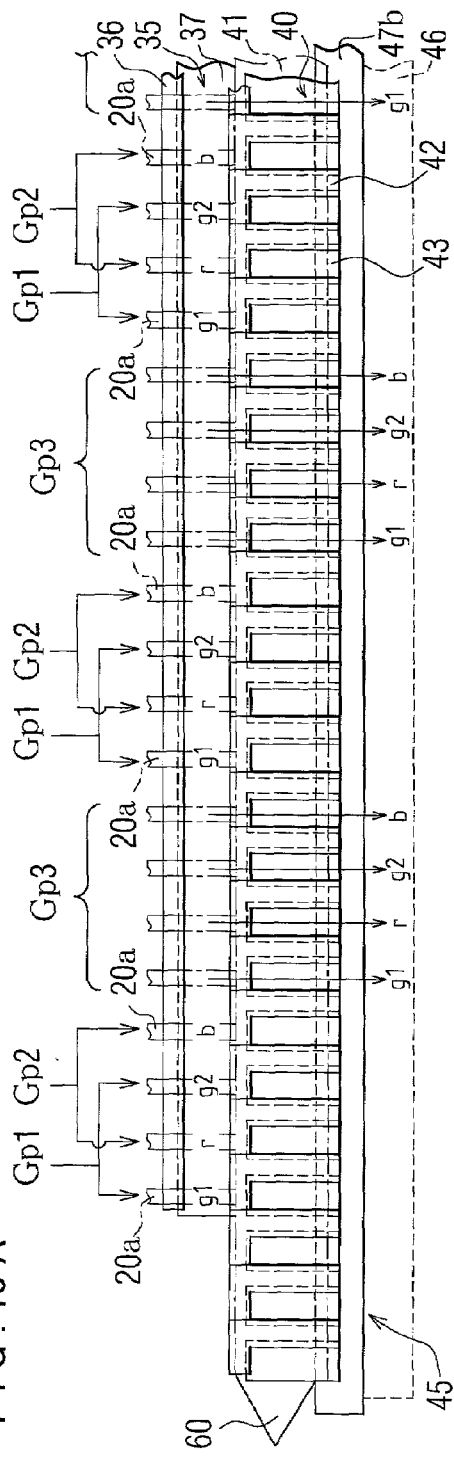
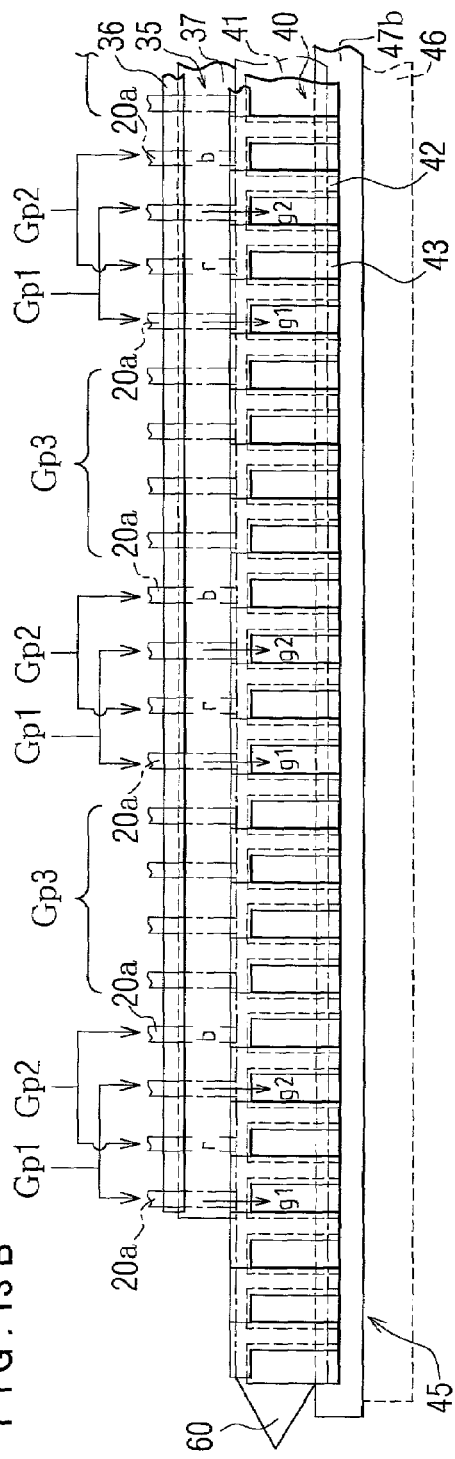
FIG. 13A
FIG. 13B

CHARGE TRANSFER DEVICE HAVING DISCHARGE DRAIN, CCD IMAGE SENSOR, AND CCD IMAGE PICKUP SYSTEM

This application is based on Japanese Patent Application 2000-304290 filed on Oct. 4, 2000, the entire contents of which are incorporated herein by reference.

BACKGROUND OF THE INVENTION a) Field of the Invention

The present invention relates to a charge transfer device which receives a plurality of charge in parallel to output the charge in series, a method of driving a charge transfer device, a charge-coupled device (CCD) image sensor including the charge transfer device, and a CCD image pickup system including the CCD image sensor.

b) Description of the Related Art

For example, a charge transfer device is produced on a semiconductor substrate as follows. A band-shaped n-channel is formed in a surface of the semiconductor substrate and a plurality of electrodes are arranged in parallel with each other to be adjacent to each other with an electrically insulating layer or simply an insulating layer between the n-type channel and the electrodes. In the configuration, the respective electrodes are disposed to intersect the n-type channel in a plan view. Such charge transfer devices including an n-type channel are mainly classified into three types as below.

In a charge transfer device of first type, the n-type channel has a substantially constant n-type impurity concentration and the insulating layer on the n-channel has also substantially constant thickness.

In the charge transfer device of this type, when voltages are applied to the respective electrodes, the potential well regions below the electrodes change such that a potential well region is formed below the electrode applied with a voltage at a relatively higher level and a potential barrier region is formed below the electrode applied with a voltage at a relatively lower level. When potential barrier regions are formed on the upstream and downstream sides of a potential well region, electric charge can be confined in the potential well region.

By appropriately controlling the voltages applied to the respective electrodes, the potential well region interposed between the two potential barrier regions can be sequentially moved in a desired direction. That is, the electric charge can be transferred in the desired direction.

In this specification, the movement of the charge transferred by the charge transfer device is regarded as a flow, and hence a relative position of each constituent member will be referred to, for example, as "at an upstream position of a unit A" or "at a downstream position of a unit B" according to necessity.

In a charge transfer device of second type, a region (to be referred to as an n$^+$-type impurity doped region herebelow) having a relatively higher n-type impurity concentration and a region (to be referred to as an n-type impurity doped region herebelow) having a relatively lower n-type impurity concentration are alternately formed in the n-type channel.

In the CCD of this type, one electrode is disposed over the n$^+$-type impurity doped region and one electrode is disposed over the n-type impurity doped region with an electrically insulating layer between the electrodes and the n-type channel. An electrode disposed over one n-type impurity doped region is commonly connected to an electrode disposed over an n$^+$-type impurity doped region at an immediately or just downstream position of the n-type impurity doped region. In this situation, one electrode may be formed on the n-type impurity doped region and the n$^+$-type impurity doped region just downstream thereof to cover these regions.

Each n$^+$-type impurity doped region serves as a potential well region for the associated n-type impurity doped region in any case. Movement of charge is restricted by the potential barrier region. The electric charge can be transferred in the predetermined direction.

The operation will be described more specifically. Assume that an n$^+$-type impurity doped region is "n$^+$-type impurity doped region A", an n-type impurity doped region at a just downstream position of the n$^+$-type impurity doped region A is "n-type impurity doped region B", and an n$^+$-type impurity doped region at a just downstream position of the n-type impurity doped region B is "n$^+$-type impurity doped region C". Electrodes are respectively disposed over these regions B and C to be commonly connected to each other.

In a state in which charge is distributed to the n$^+$-type impurity doped region A (potential well region), when a relatively higher voltage is applied to the electrodes respectively of the n-type impurity doped region B and the n$^+$-type impurity doped region C, the n-type impurity doped region B does not serve as a potential barrier region for the n$^+$-type impurity doped region A. The n$^+$-type impurity doped region C is a potential well region for the n-type impurity doped region B in any situation. Therefore, the charge distributed to the n$^+$-type impurity doped region A moves via the n-type impurity doped region B to the n$^+$-type impurity doped region C.

The n-type impurity doped region B functions as a potential barrier region for the n$^+$-type impurity doped region C. Even when the amplitude of the voltage of the electrodes respectively of the n-type impurity doped region B and the n$^+$-type impurity doped region C is restored to the original value, the charge does not return from the n$^+$-type impurity doped region C to the n$^+$-type impurity doped region A at all.

In a charge transfer device of third type, the n-type channel has a substantially constant n-type impurity concentration. The insulating layer on the n-channel alternately includes a region (thick region) having relatively larger thickness and a region (thin region) having relatively smaller thickness.

Ordinarily, one electrode is disposed on each of the thick and thin regions. One electrode on a thin region is connected to one electrode on a thick region at just downstream position of the thin region. These electrodes are commonly connected to each other. In this case, one electrode may be formed on the thin region and the thick region just downstream thereof to cover these regions.

In the CCD of this type even when a fixed voltage is applied to the respective electrode, if the n-type channel is a buried type channel, a potential barrier region is formed below the thin region and a potential well region is formed below the thick region. The electric charge can be transferred in the predetermined direction.

A CCD image sensor is a representative electronic unit using the charge transfer device. CCD image sensors are mainly classified into two kinds, namely, CCD linear (line) image sensors and CCD area image sensors.

A CCD area image sensor ordinarily includes two kinds of charge transfer devices, that is, a vertical charge transfer device called "VCCD" and a horizontal charge transfer device called "HCCD".

In a CCD area image sensor of inter-line type, a large number of photoelectric converter elements or photoelectric converters are arranged in a matrix-shape including a plurality of rows and a plurality of columns. A VCCD is disposed for each column of photoelectric converters. In many CCD area image sensors, all the VCCD is electrically connected to one HCCD. A CCD area image sensor including a plurality of horizontal charge transfer devices has also been known.

The VCCD is generally composed of a charge transfer device of a type in which the n-type channel has a substantially constant n-type impurity concentration and the insulating layer on the n-type channel has substantially constant thickness. The VCCD is ordinarily driven by vertical driving signals of three phases or more. In each VCCD, one electrode and a portion of the n-channel region therebelow forms one vertical charge transfer stage. About two to about four vertical charge transfer stages are disposed for one photoelectric converter.

In the HCCD, for example, an $n^+$-type impurity doped region and an n-type impurity doped region are alternately formed in the n-type channel. A pair of electrodes commonly connected each other is disposed on a pair of adjacent $n^+$-type and n-type impurity doped regions. These adjacent regions and the commonly connected electrodes form one horizontal charge transfer stage. Two horizontal charge transfer stages are disposed for one VCCD. The HCCD is ordinarily driven by two-phase horizontal driving signals.

A CCD system, for example, an electronic or digital still camera has been developed using a CCD area image sensor.

A digital still camera includes a small-sized monitor (display). A user of the camera can select a still picture recording mode to record a still picture and a monitor mode to display an image on the monitor. The monitor mode is used, for example, to determine an angle of view for a still picture.

The number of pixels of a still picture shot by a digital still camera has reached several millions these days and is about to exceed six millions. On the other hand, the number of pixels for a mobile picture displayed by the digital still camera in the monitor mode is about 100 thousand to about 400 thousand in general.

Therefore, in the monitor mode, charges are read only from part of the photoelectric converter rows to be stored into the vertical charge transfer devices. A thin-out scanning is conducted to thin out one half or more of the photoelectric converter rows. Or, an operation to mix charges in the VCCD (vertical addition) is performed. That is, in each photoelectric converter column, charges stored in two or more adjacent photoelectric converters are mixed in a VCCD (vertical addition). The addition of charges increases an amount of signal (charge) treated as one pixel in the signal processing. The shooting sensitivity advantageously increases in proportion to the increase of the amount of signal (charge) of the resultant signal. A relatively brighter picture or image can be reproduced.

In a CCD image pickup system for color pictures, a color filter array is used to obtain full color information. The color filter array includes a plurality of color filters repetitiously arranged in a predetermined pattern. One color filter corresponds to one photoelectric converter.

Image data in which the vertical pixels are thinned out can be obtained by conducting either one or both of the thin-out scanning and the mixing (vertical addition) of charges in the VCCD.

However, an HCCD capable of thinning out charges simultaneously (concurrently) received from the vertical charge transfer devices electrically connected to the HCCD has not been proposed. Similarly, an HCCD capable of conducting the mixing (horizontal addition) of charges has not been proposed.

SUMMARY OF THE INVENTION

It is therefore an object of the present invention to provide a charge transfer apparatus capable of thinning out desired charges.

Another object of the present invention is to provide a method of driving a charge transfer apparatus capable of thinning out desired charges.

Further another object of the present invention is to provide a CCD image sensor capable of transferring by a horizontal charge transfer device (HCCD) only desired charges from charges stored in vertical charge transfer devices (VCCDs) by a readout operation.

Still another object of the present invention is to provide a CCD image pickup system in which only desired charges can be transferred by a horizontal charge transfer device (HCCD) from charges stored in vertical charge transfer devices (VCCDS) by a readout operation.

According to one aspect of the present invention, there is provided a charge transfer apparatus, comprising a semiconductor substrate; N first charge transfer channel regions of a first conductivity type formed in one surface of the semiconductor substrate; a charge transfer device including a first-conductivity-type second charge transfer channel, said second charge transfer channel being formed in said surface of the semiconductor substrate and being electrically connected to each of said first transfer channel regions, said charge transfer device including at least N transfer electrodes formed on said second charge transfer channel with an electrically insulating layer therebetween, said at least N transfer electrodes respectively corresponding to said first charge transfer channel regions in a correspondence in which at least one said transfer electrode is disposed for each said first charge transfer channel region, said at least N transfer electrodes being classified into a plurality of groups of which each including m successive transfer electrodes, m being a positive integer equal to or more than three, each of said m successive transfer electrodes including n electrodes connected to electrically independent voltage supply lines, n being a positive integer equal to or less than m, each one of said transfer electrodes in each said group with a period of m transfer electrodes being connected to one identical voltage supply line; and a discharge drain including a first-conductivity-type drain region formed in said surface of the semiconductor substrate along said second charge transfer channel, said drain region being electrically connectable to said second charge transfer channel.

According to another aspect of the present invention, there is provided a charge transfer apparatus, comprising a semiconductor substrate; a plurality of first charge transfer channel regions of a first conductivity type formed in one surface of the semiconductor substrate; a charge transfer device including a first-conductivity-type second charge transfer channel, said second charge transfer channel being formed in said surface of the semiconductor substrate and being electrically connected to each of said first transfer channel regions, said charge transfer device having a structure capable of producing a plurality of charge transfer stages formed in one line, each of said charge transfer stages corresponding to associated one of said first charge transfer channel regions, each said charge transfer stage including only one first potential barrier region and only one first potential well region; and a discharge drain including a first-conductivity-type drain region formed in said surface of the semiconductor substrate along said second charge transfer channel, said drain region being electrically connectable to said second charge transfer channel.

According to further another aspect of the present invention, there is provided a driving method of a charge transfer apparatus comprising a semiconductor substrate; N first charge transfer channel regions of a first conductivity type formed in one surface of the semiconductor substrate; a charge transfer device including a first-conductivity-type second charge transfer channel, said second charge transfer channel being formed in said surface of the semiconductor substrate and being electrically connected to each of said first transfer channel regions, said charge transfer device including at least N transfer electrodes formed on said second charge transfer channel with an electrically insulating layer therebetween, said at least N transfer electrodes respectively corresponding to said first charge transfer channel regions in a correspondence in which at least one said transfer electrode is disposed for each said first charge transfer channel region, said at least N transfer electrodes being classified into a plurality of groups of which each including m successive transfer electrodes, m being a positive integer equal to or more than three, each of said m successive transfer electrodes including n electrodes connected to electrically independent voltage supply lines, n being a positive integer equal to or less than m, each one of said transfer electrodes in each said group with a period of m transfer electrodes being connected to one identical voltage supply line; and a discharge drain including a first-conductivity-type drain region formed in said surface of the semiconductor substrate along said second charge transfer channel, said drain region being electrically connectable to said second charge transfer channel, comprising the steps of: (A) transferring charges from part of said N first charge transfer channel regions to said charge transfer device and discharging said charges from said charge transfer device to said discharge drain; (B) transferring charges, to said charge transfer device, from said first charge transfer channel regions from which charges are not transferred to said charge transfer device in said step (A); and (C) transferring charges transferred to said charge transfer device in said step (B) in a predetermined direction in said charge transfer device.

According to still another aspect of the present invention, there is provided a driving method of a charge transfer apparatus comprising a semiconductor substrate; a plurality of first charge transfer channel regions of a first conductivity type formed in one surface of the semiconductor substrate; a charge transfer device including a first-conductivity-type second charge transfer channel, said second charge transfer channel being formed in said surface of the semiconductor substrate and being electrically connected to each of said first transfer channel regions, said charge transfer device having a structure capable of producing a plurality of charge transfer stages formed in one line, each of said charge transfer stages corresponding to associated one of said first charge transfer channel regions, each said charge transfer stage including only one first potential barrier region and only one first potential well region; and a discharge drain including a first-conductivity-type drain region formed in said surface of the semiconductor substrate along said second charge transfer channel, said drain region being electrically connectable to said second charge transfer channel, comprising the steps of: (A) transferring charges from part of said N first charge transfer channel regions to said charge transfer device and discharging said charges from said charge transfer device to said discharge drain; (B) transferring charges, to said charge transfer device, from said first charge transfer channel regions from which charges are not transferred to said charge transfer device in said step (A); and (C) transferring charges transferred to said charge transfer device in said step (B) in a predetermined direction in said charge transfer device.

According to still another aspect of the present invention, there is provided a CCD image sensor, comprising a semiconductor substrate; a large number of photoelectric converters formed in one surface of said semiconductor substrate in the form of a matrix including a plurality of rows and a plurality of columns; a plurality of vertical charge transfer devices formed in said surface of the semiconductor substrate, said vertical charge transfer devices corresponding respectively to said photoelectric converter columns, each said vertical charge transfer device extending along said corresponding photoelectric converter column; a CCD line memory section capable of producing at least one charge transfer stage formed for each said vertical charge transfer device at a position downstream said each vertical charge transfer device, each said charge transfer stage including a first-conductivity-type first charge transfer channel region continuous to said associated vertical charge transfer device; a horizontal charge transfer device comprising a first-conductivity-type horizontal charge transfer channel formed in said surface of the semiconductor substrate with being electrically connected to each said first charge transfer channel regions, and a plurality of horizontal transfer electrodes formed over said horizontal charge transfer channel with an electrically insulating layer therebetween; and a discharge drain including a first-conductivity-type drain region formed in said surface of the semiconductor substrate along said horizontal charge transfer channel, said drain region being electrically connectable to said horizontal charge transfer channel.

According to still another aspect of the present invention, there is provided a CCD image pickup system, comprising a CCD image sensor comprising a semiconductor substrate; a large number of photoelectric converters formed in one surface of said semiconductor substrate in the form of a matrix including a plurality of rows and a plurality of columns; a plurality of vertical charge transfer devices formed in said surface of the semiconductor substrate, said vertical charge transfer devices corresponding respectively to said photoelectric converter columns, each said vertical charge transfer device extending along said corresponding photoelectric converter column; a CCD line memory section capable of producing at least one charge transfer stage formed for each said vertical charge transfer device at a position downstream said each vertical charge transfer device, each said charge transfer stage including a first-conductivity-type first charge transfer channel region continuous to said associated vertical charge transfer device; a horizontal charge transfer device comprising a first-conductivity-type horizontal charge transfer channel formed in said surface of the semiconductor substrate with being electrically connected to each said first charge transfer channel regions, and a plurality of horizontal transfer electrodes formed over said horizontal charge transfer channel with an electrically insulating layer therebetween; and a discharge drain including a first-conductivity-type drain region formed in said surface of the semiconductor substrate along said horizontal charge transfer channel, said drain region being electrically connectable to said horizontal charge transfer channel; an output section disposed inside or outside said CCD image sensor for converting charges outputted from said horizontal charge transfer device into signal voltages; a driving circuit for generating driving signals and/or control signals to be supplied to said vertical charge transfer devices, said CCD line memory section, and said horizontal charge transfer device; and a video signal proceeding circuit for generating image data using said signal voltages generated by said output section.

By the CCD image sensor as described above, it is possible that the first charge transfer channel region electrically connected to the horizontal charge transfer device are classified into groups, and charges can be selectively transferred from the first charge transfer channel regions as well as from the vertical charge transfer devices in a unit of groups to the horizontal charge transfer device. Charges in the horizontal charge transfer device can be discharged to the discharge drain. Resultantly, desired charges selected from charges stored in the vertical charge transfer devices by a readout operation can be transferred by the horizontal charge transfer device to a subsequent device.

A charge transfer operation can be conducted, for example, only for the first charge transfer channel regions to which charges (to be referred to as "unnecessary charges" in this specification) not required to contribute to the generation of image data are distributed. That is, the unnecessary charges are transferred from the first charge transfer channel regions (transfer control stages) to the horizontal charge transfer device and discharged to the discharge drain.

Thereafter, only for the first charge transfer channel regions to which charges (to be referred to as "necessary charges" in this specification) required to contribute to generation of image data are distributed, the necessary charges are transferred from the first charge transfer channel regions (transfer control stages) to the horizontal charge transfer device. A desired image signal can be obtained by transferring the necessary charges, for example, to the output amplifier by the horizontal charge transfer device. Desired image data can be obtained by supplying the image signals, for example, to a video signal proceeding circuit.

By combining the unnecessary charges discharging operation described above with at least one of the thin-out scanning and the mixing (vertical addition) of charges in vertical charge transfer devices, it is possible to easily generate image data in which the numbers respectively of the vertical pixels and the horizontal pixels are thinned out. A better playback image (monitor image) can be easily obtained.

During the thin-out scanning, charges which cause a smear can be discharged from the horizontal charge transfer device to the discharge drain.

BRIEF DESCRIPTION OF THE DRAWINGS

The objects and features of the present invention will become more apparent from the consideration of the following detailed description taken in conjunction with the accompanying drawings in which:

FIG. 11 is a partial plan view schematically showing a wiring example to drive the horizontal charge transfer device by four-phase horizontal driving signals in the CCD image sensor of the first embodiment;

FIG. 13A is a schematic diagram showing a state of a charges distribution at time T1 of FIG. 12;

FIG. 13B is a schematic diagram showing a state of a charges distribution at time T2 of FIG. 12;

DETAILED DESCRIPTION OF THE PREFERRED EMBODIMENTS

Figure 1:
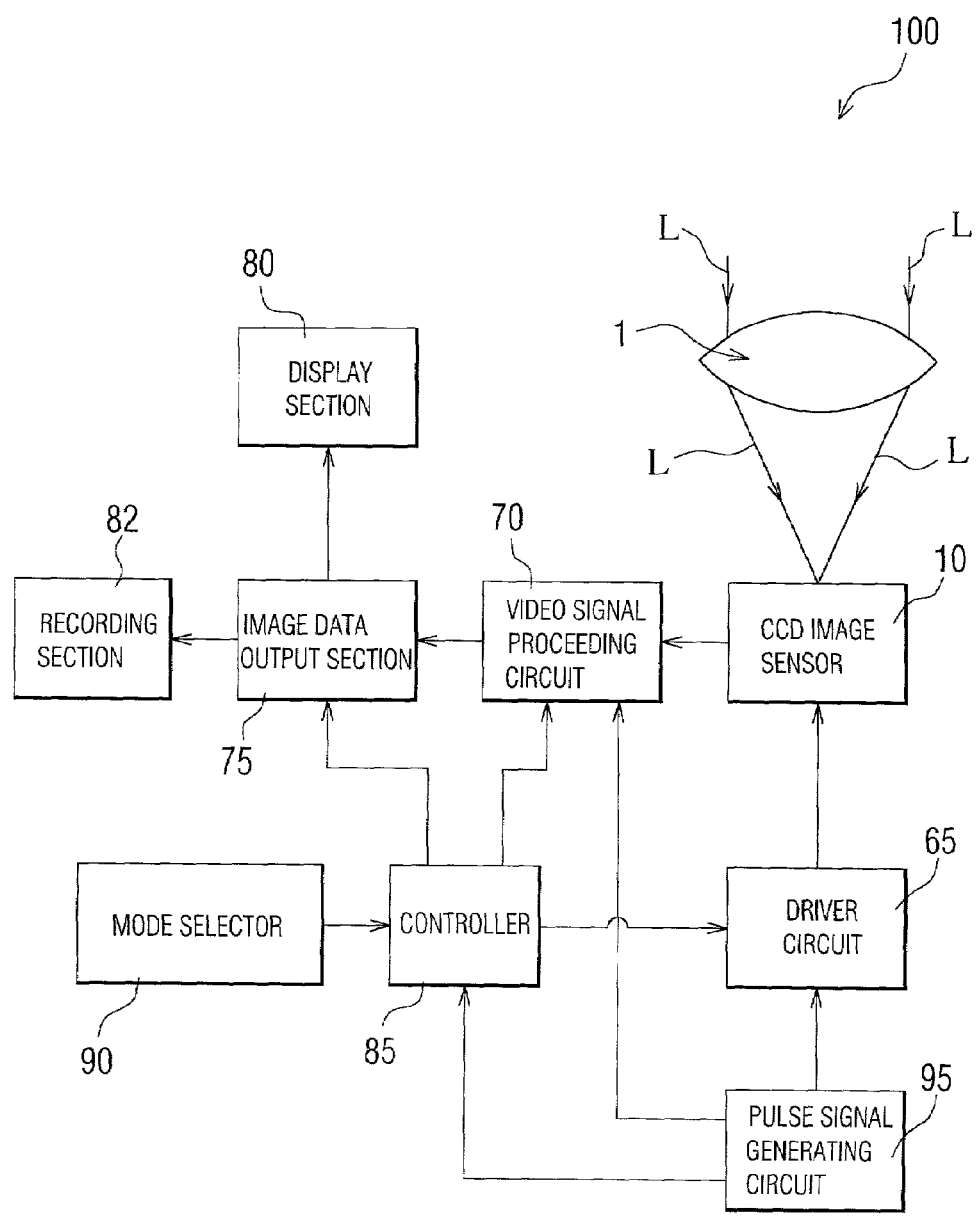
FIG. 1 is a block diagram showing an outline of an embodiment of a CCD image pickup system.

FIG. 1 shows an outline of an embodiment of a CCD image pickup system 100 in a block diagram. The system 100 of FIG. 1 includes an image pickup optical system 1, a CCD image sensor 10, a driver circuit 65, a video signal proceeding circuit 70, an image data output section 75, a display section 80, a recording section 82, a controller 85, a mode selector 90, and a pulse signal generating circuit 95.

The image pickup optical system 1 focuses an optical image onto the CCD image sensor 10. The optical system 1 includes, for example, optical lenses, an iris, and an optical low-pass filter. An arrow mark L indicates a light beam in FIG. 1.

The CCD image sensor 10 converts the optical image focused by the optical system 1 into electric signals. The CCD image sensor 10 includes photoelectric converters, vertical charge transfer devices (VCCDs), a horizontal CCD (HCCD), an output section, and a color filter array. Details of the CCD image sensor 10 will be described later.

The driving circuit 65 supplies driving signals and control signals necessary for operations of the CCD image sensor 10 thereto. The driving circuit 65 includes, for example, a vertical driver, a horizontal driver, and a direct-current (dc) power source.

The video signal proceeding circuit 70 receives the image signal generated by the CCD image sensor 10 and executes various processing for the image signal to produce image data. The video signal proceeding circuit 70 includes, for example, an analog-to-digital converter, a correlational double sampling (CDS) circuit, a color separating circuit, a delay line.

The image data output section 75 receives the image data outputted from the video signal proceeding circuit 70 and stores the image data, for example, on a recording medium such as a frame memory.

The display section 80 receives the image data from the image data output section 75 to display a still or mobile picture thereon according to the image data. The display section 80 includes a display, for example, a liquid-crystal display.

The recording section 82 receives the image data from the image data output section 75 and records the image data on a recording medium such as a memory card.

The controller 85 controls operations of the driving circuit 65, the video signal proceeding circuit 70, and the image data output section 75. The controller 85 includes, for example, a central processing unit (CPU).

The mode selector 90 is a selecting switch to select a shooting mode or an operation mode of the CCD image pickup system 100. The system 100 operates in at least two modes, namely, a still picture recording mode in which a still picture is shot to be recorded on a recording medium and a monitor mode in which a mobile or still picture is shot to be displayed on the display section 80. The mode selector 90 is operated by a user of the CCD image pickup system 100.

The pulse signal generating circuit 95 generates pulse signals to adjust operation timing in the system and supplies the pulse signals to the driving circuit 65, the video signal proceeding circuit 70, and the controller 85. The pulse signal generating circuit 95 includes, for example, an inherent oscillator and a timing signal generating curcuit.

The CCD image sensor 10 of the CCD image pickup system 100 is a CCD image sensor which can thin out, in the photoelectric converter column and row directions, desired photoelectric converters from a large number of photoelectric converters arranged in a matrix to output a resultant image signal. A configuration of the CCD image sensor 10 will be next described by referring to an embodiment.

Figure 2:
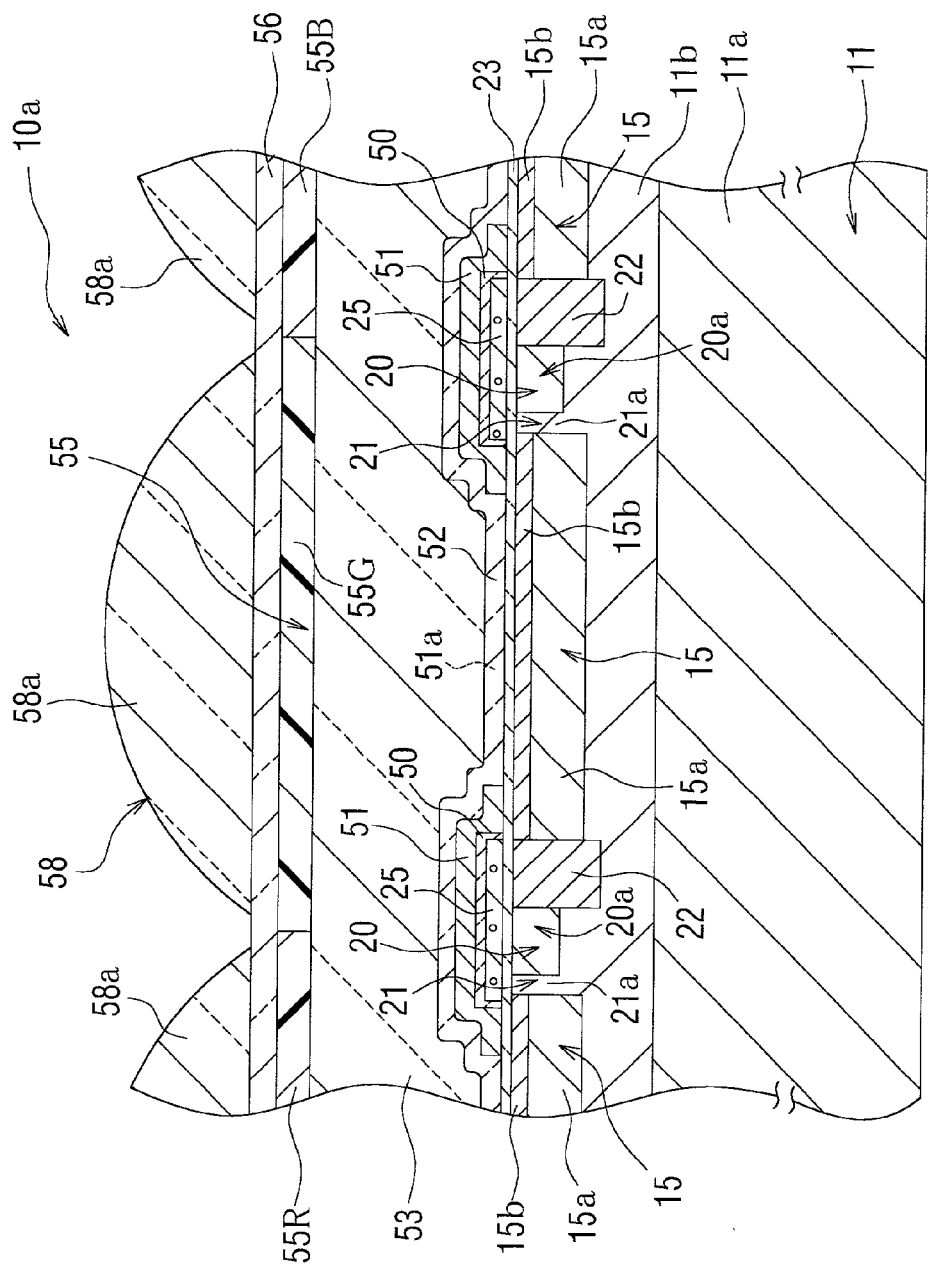
FIG. 2 is a cross-sectional view schematically showing a photoelectric converter and its periphery in a first embodiment of a CCD image sensor.

FIG. 2 schematically shows a photoelectric converter and its periphery in the CCD image sensor 10a of the first embodiment in a cross-sectional view. FIG. 2 shows three photoelectric converters including those partially shown.

In the CCD image sensor 10a of FIG. 2, photoelectric converters are formed in one surface of a semiconductor substrate 11. The substrate 11 includes an n-type semiconductor substrate 11a such as an n-type silicon substrate and a p-type impurity doped region 11b formed thereon.

The photoelectric converter 15 is, for example, a buried type photo diode in which an n-type impurity doped region 15a is formed at a predetermined position of a p-type impurity doped region 11b and a $p^+$-type impurity doped region 15b is formed on the n-type impurity doped region 15a. Each n-type impurity doped region 15a serves as a charge accumulating region.

A vertical charge transfer channel 20a having a width of about 0.3 µm to about 5 µm is disposed in the vicinity of a right edge section of each photoelectric converter 15 shown in FIG. 2. Each vertical charge transfer channel 20a basically includes an n-channel structure in which an n-type impurity doped region is disposed in the p-type impurity doped region 11b, and partly includes a $p^-$-type impurity doped region formed on the n-type impurity doped region, which will be described later.

The p-type impurity doped region 11b is exposed at one position along a right edge section of each photoelectric converter 15 (n-type impurity doped region 15a). This region of the p-type impurity doped region 11b is used as a readout gate channel region 21a. Each channel region 21a extends from a substantially central section of the right edge section of the photoelectric converter 15 to a downstream edge section thereof in a plan view. A vertical charge transfer channel 20a and an associated photoelectric converter 15 are adjacent to each other with a readout gate channel region 21a therebetween.

A channel stop region 22 surrounds each photoelectric converter 15 excepting the region in which the readout gate channel region 21a is formed in a plan view. The channel stop region 22 electrically separates the photoelectric converters 15 from each other and the photoelectric converter 15 from the vertical charge transfer channel 20a. The channel stop region 22 formed between the photoelectric converter 15 and the vertical charge transfer channel 20a in a plan view has a width of, for example, about 0.5 µm.

In a section downstream of the most downstream photoelectric converter row, a channel stop region 22 is formed around each vertical charge transfer channel 20a in a plan view. The channel stop region 22 is formed, for example, by disposing a $p^+$-type impurity doped region at a predetermined position of the p-type impurity doped region 11b.

The regions containing impurity can be formed, for example, using an ion implanting process and a subsequent annealing process. A p-type impurity doped region 11b can also be formed, for example, using an epitaxial growth process. The $p^+$-type impurity doped region has a p-type impurity concentration higher than that of the p-type impurity doped region. The $p^-$-type impurity doped region has a p-type impurity concentration lower than that of the p-type impurity doped region.

An electrically insulating layer 23 having substantially constant thickness is formed on one surface of the semiconductor substrate 11, the surface being on the side in which the impurity doped regions are formed (including surfaces of the impurity doped regions).

The insulating layer 23 is formed using, for example, insulating oxide such as silicon oxide or insulating nitride such as silicon nitride. The insulating layer 23 is a single-layer structure of one insulating oxide layer, a two-layer lamination structure including an insulating oxide layer and an insulating nitride layer formed thereon, or a three-layer lamination structure including an insulating oxide layer, an insulating nitride layer formed thereon, and an insulating oxide layer formed on the insulating nitride layer.

First and second vertical transfer electrodes 25 and 26, first to third subordinate transfer electrodes 31 to 33, first and second transfer control electrodes 36 and 37, first and second horizontal transfer electrodes 42 to 43, and a discharge gate electrode 47a are formed on the insulating layer 23. However, FIG. 2 shows only the first vertical transfer electrode 25. The electrodes not shown in FIG. 2 will be described later in detail by referring to FIG. 4 or 5.

Each of the electrodes 25 and 26, 31 to 33, 36 and 37, 42 and 43, and 47a is covered with an electrically insulating film (thermal oxidation film) 50. One region of the first vertical transfer electrode 25 covers one region of the vertical charge transfer channel 20a in a plan view to collectively form a vertical charge transfer device (VCCD) 20. Another region of the first vertical transfer electrode 25 covers the readout gate channel region 21a in a plan view to collectively form a readout gate 21.

When a readout pulse, which will be described later, is applied to the first vertical transfer electrode 25, a second-conductive-type channel, i.e., a p-type channel is induced in the readout gate 21 (readout gate channel region 21a) and hence a conducting state is established between the photoelectric converter 15 (n-type impurity doped region 15a) and the associated vertical charge transfer channel 20a.

A light shielding layer 51 covers the insulating layer 23 and various electrodes formed thereon. The light shielding layer 51 has one opening 51a of a predetermined contour over each photoelectric converter 15 ($p^+$-type impurity doped region 15b). The opening 51a is disposed within an outer circumferential surface of the n-type impurity doped region 15a of the photoelectric converter 15 in a plan view.

The light shielding layer 51 is formed using, for example, a metallic thin film of aluminum, chromium, wolfram, titanium, or molybdenum; an alloy thin film of an alloy made of a combination of these metals, or a multi-layer metallic thin film including at least two selected from the metallic and alloy thin films.

A protection layer 52 is formed on the light shielding layer 51 and the insulating layer 23 exposed to the opening 51a. The protection layer 52 is formed using, for example, silicon nitride, silicon oxide, phosphosilicate glass (PSG), borophosphosilicate glass (BPSG), or polyimide.

A first planarizing layer 53 covers the protection layer 52. The first planarizing layer 53 also serves as a focus adjusting layer for microlenses. According to necessity, inner lenses are formed in the first planarizing layer 53.

The first planarizing layer 53 is formed by coating a desired thickness of transparent resin such as photo resist using, for example, a spin coating process.

A color filter array 55 is formed on the first planarizing layer 53. The color filter array 55 is formed in a predetermined pattern including a plurality of color filters for producing a color picture or image. Color filter arrays for color pictures are classified into two types, that is, color filter arrays of primary color type and color filter arrays of complementary color type.

In both types of color filter arrays, one color filter is disposed over each photoelectric converter 15. The color filter layout pattern of the color filter array 55 will be later described in detail by referring to FIG. 3. FIG. 2 shows one red filter 55R, one green filter 55G, and one blue filter 55B.

The color filter array 55 can be produced, for example, by forming layers of a resin (color resin) containing pigments or dyes of desired colors at a predetermined position using, for example, photolithography.

A second planarizing layer 56 is formed on the color filter array 55. The second planarizing layer 56 can be formed by coating a desired thickness of transparent resin such as photo resist using, for example, a spin coating process.

A microlens array 58 is formed on the second planarizing layer 56. The microlens array 58 includes microlenses 58a such that one microlens 58a is disposed over each photoelectric converter 15.

The microlenses 58a are formed, for example, as follows. A layer of transparent resin (including photo resist) having a refractive index ranging from about 1.3 to about 2.0 is subdivided into predetermined partitions by, for example, photolithography. The transparent resin of each partition is molten by thermal treatment, the corners of the partition are rounded by surface tension, and then each partition is cooled down.

Figure 3:
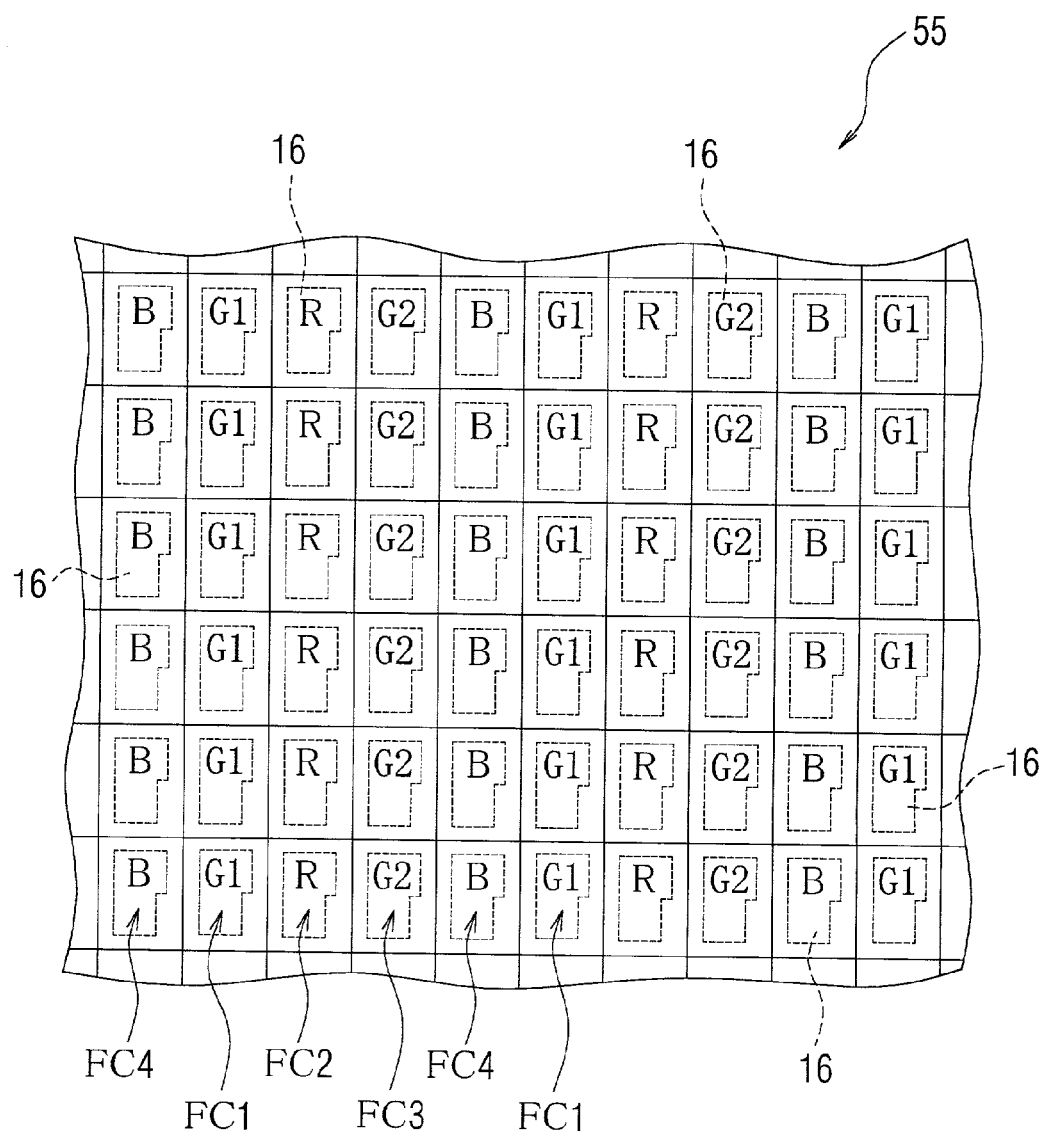
FIG. 3 is a plan view showing part of a color filter array disposed in the CCD image sensor of the first embodiment.

FIG. 3 shows part of the color filter array 55 in a plan view. In FIG. 3, a red filter is indicated by a symbol R, a green filter is indicated by a symbol G1 or G2, and a blue filter is indicated by a symbol B for convenience.

In the color filter array 55 of FIG. 3, a first color filter column FC1 including only green filters G1, a second color filter column FC2 including only red filters R, a third color filter column FC3 including only green filters G2, and a fourth color filter column FC4 including only blue filters B are repeatedly arranged in this order in a direction from the left side to the right side in FIG. 3.

The green filters G1 of the first color filter column FC1 and the green filters G2 of the third color filter column FC3 are made of the same material, and only the reference symbols thereof are different from each other for convenience.

In FIG. 3, an area surrounded by a broken line in each color filter indicates a contour of a photoelectric converter region 16, which will be described later.

Figure 4:
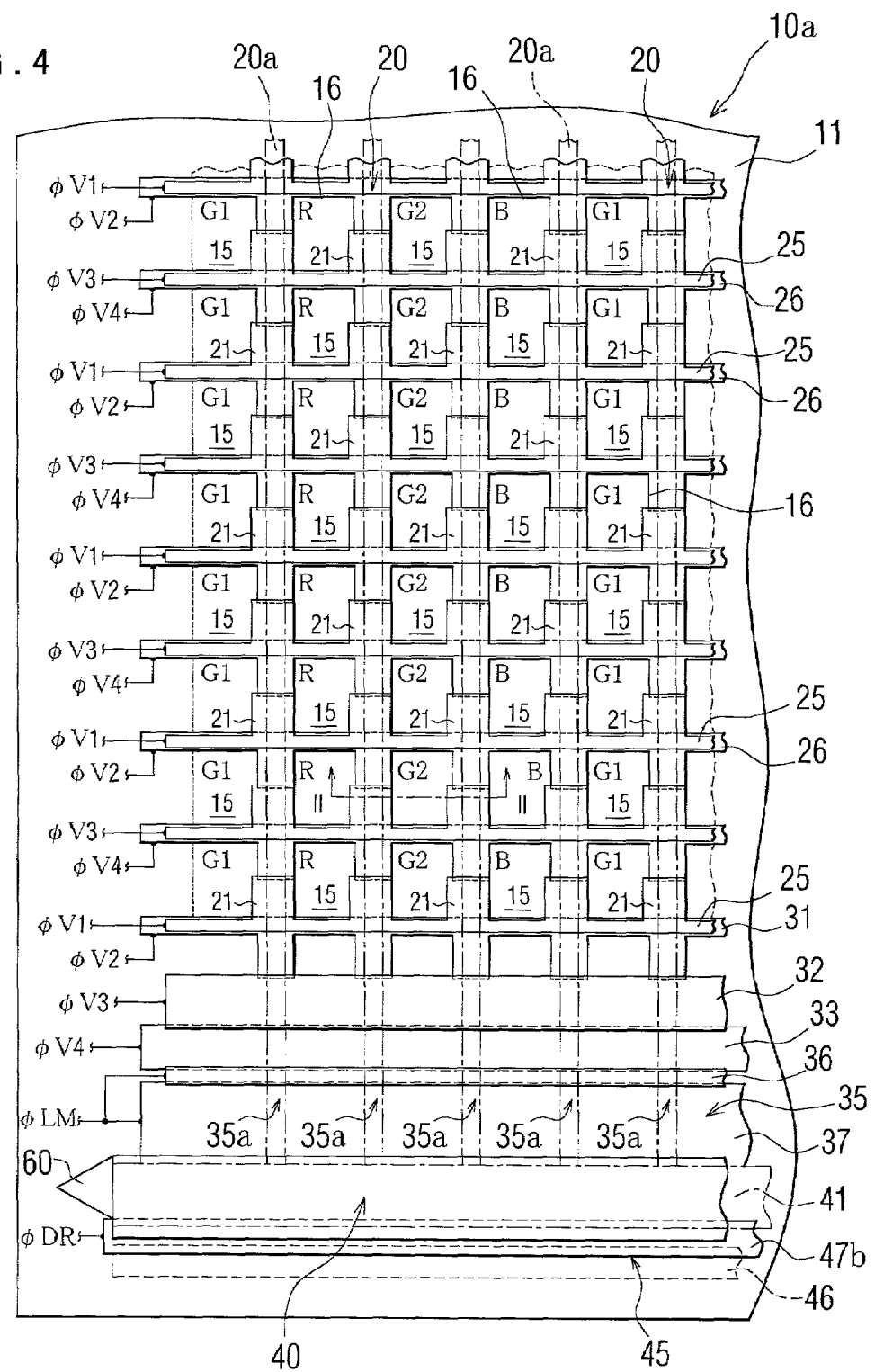
FIG. 4 a partial plan view schematically showing the CCD image sensor of the first embodiment.

FIG. 4 schematically shows the CCD image sensor 10a in a partial plan view. FIG. 4 does not show the light shielding layer 51, the protection layer 52, the first and second planarizing layer 53 and 56, and the microlens array 58 of FIG. 2. Although the color filter array 55 is not shown, the colors of the respective color filters disposed over the photoelectric converters 15 are respectively indicated by symbols G1, G2, R, and B. The meanings of symbols G1, G2, R, and B are the same as those of FIG. 3. In FIG. 4, the same constituent components as those of FIG. 2 are assigned with the same reference numerals as those of FIG. 2.

As shown in FIG. 4, in the CCD image sensor 10a, a large number of photoelectric converters 15 are disposed on the semiconductor substrate 11 in an array having columns and rows. In an actual CCD image pickup system, the number of photoelectric converters exceeds, for example, several millions. The pitch of the photoelectric converters in the column or row direction of the photoelectric converters is appropriately selected within a range of, for example, from 2 μm to 10 μm. One vertical charge transfer channel 20a is disposed for each photoelectric converter column, along a right side (in FIG. 4) of the column and in the vicinity thereof.

One first vertical transfer electrode 25 and one second vertical transfer electrode 26 are arranged for each photoelectric converter row. Each first vertical transfer electrode 25 intersects each vertical charge transfer channel 20a in a plan view and extends along the associated photoelectric converter row in a downstream side thereof. Each second vertical transfer electrode 26 intersects each vertical charge transfer channel 20a in a plan view and extends along the associated photoelectric converter row in an upstream side thereof.

Each first vertical transfer electrode 25 constitute one readout gate 21 together with one readout gate channel region 21a (FIG. 2) on the right side (in FIG. 4) of each associated photoelectric converter 15. FIG. 2 schematically shows a magnified cross section along line II—II of FIG. 4.

The first and second vertical transfer electrodes 25 and 26 corresponding to one photoelectric converter row surround each photoelectric converter in the photoelectric converter row in a plan view to define the photoelectric converter region 16 thereof, excepting the photoelectric converters 15 contained in the left-most photoelectric converter column.

On a downstream side of the first vertical transfer electrode at the most downstream position, one first subordinate transfer electrode 31, one second subordinate transfer electrode 32, and one third subordinate transfer electrode 33 are disposed in this order. Each of the electrodes 31 to 33 intersects each vertical charge transfer channel 20a in a plan view and extends in the direction of the photoelectric converter row.

The first and second transfer control electrodes 36 and 37 are disposed in this order on a downstream side of the third subordinate transfer electrode 33. The first and second transfer control electrodes 36 and 37 also intersect each vertical charge transfer channel 20a in a plan view and extend in the direction of the photoelectric converter row.

The second vertical transfer electrode 26, the first subordinate transfer electrode 31, the third subordinate transfer electrode 33, and the second transfer control electrode 37 are formed using a first polycrystalline silicon layer disposed at a first level on the semiconductor substrate 11. The first vertical transfer electrode 25, the second subordinate transfer electrode 34, and the first transfer control electrode 36 are formed using a second polycrystalline silicon layer disposed at a second level higher than the first level on the semiconductor substrate 11. Each of the electrodes 25 and 26, 31 to 33, and 36 and 37 is covered with an insulating layer (thermal oxidation layer) 50, for example, as shown in FIG. 2.

In each vertical charge transfer channel 20a, a region thereof opposing the first vertical transfer electrode 25, the second vertical transfer electrode 26, the first subordinate transfer electrode 31, the second subordinate transfer electrode 32, or the third subordinate transfer electrode 33 constitute one vertical charge transfer stage together with the electrode 25, 26, 31, 32, or 33 thereon.

The vertical charge transfer stages including one vertical charge transfer channel 20a are aligned in a direction of the photoelectric converter column to form one vertical charge transfer device 20. The region of the vertical charge transfer device 20 in each vertical charge transfer channel 20a is an n-type channel.

On the other hand, in each vertical charge transfer channel 20a, a region thereof opposing the first transfer control electrode 36 and the second transfer control electrode 37 configures one charge transfer stage 35a together with the electrodes 36 and 37 thereon. The charge transfer stage 35a will be referred to as "transfer control stage 35a" herebelow.

The transfer control stages 35a collectively forms one CCD line memory section 35. The structure of the vertical charge transfer channel 20a in the CCD line memory section 35 will be described later in detail by referring to FIG. 6A.

A downstream end of each vertical charge transfer channel 20a (a downstream end of the first charge transfer channel region) is electrically connected to a horizontal charge transfer device (HCCD) 40.

A discharge domain 45 is disposed along the horizontal charge transfer device 40. The discharge drain 45 opposes the CCD line memory section 35 with the horizontal charge transfer device 40 therebetween in a plan view.

The discharge drain 45 includes an n-type drain region 46 disposed in the p-type impurity doped region 11b of the semiconductor substrate 11, a discharge drain channel region formed using the p-type impurity doped region 11b, and a discharge gate electrode 47b formed on the discharge drain channel region with an insulating layer therebetween. The structure of the discharge drain 45 will be described in detail later by referring to FIGS. 6A and 6B.

An output section 60 is connected to one port of the horizontal charge transfer device 40. The output section 60 converts electric charge sent from the horizontal charge transfer device 40 into a signal voltage using, for example, a floating capacity, not shown, and amplifies the signal voltage by, for example, a source follower circuit, not shown. After the signal detection or conversion, charge of the floating capacity is absorbed in a power source, not shown, via a reset transistor, not shown. The output section can be composed, for example, in the same way as for the output section described in the 0084th to 0091st paragraphs of Japanese Patent Application Ser. No. Hei 11-287326 by referring to FIG. 4(b).

Figure 5:
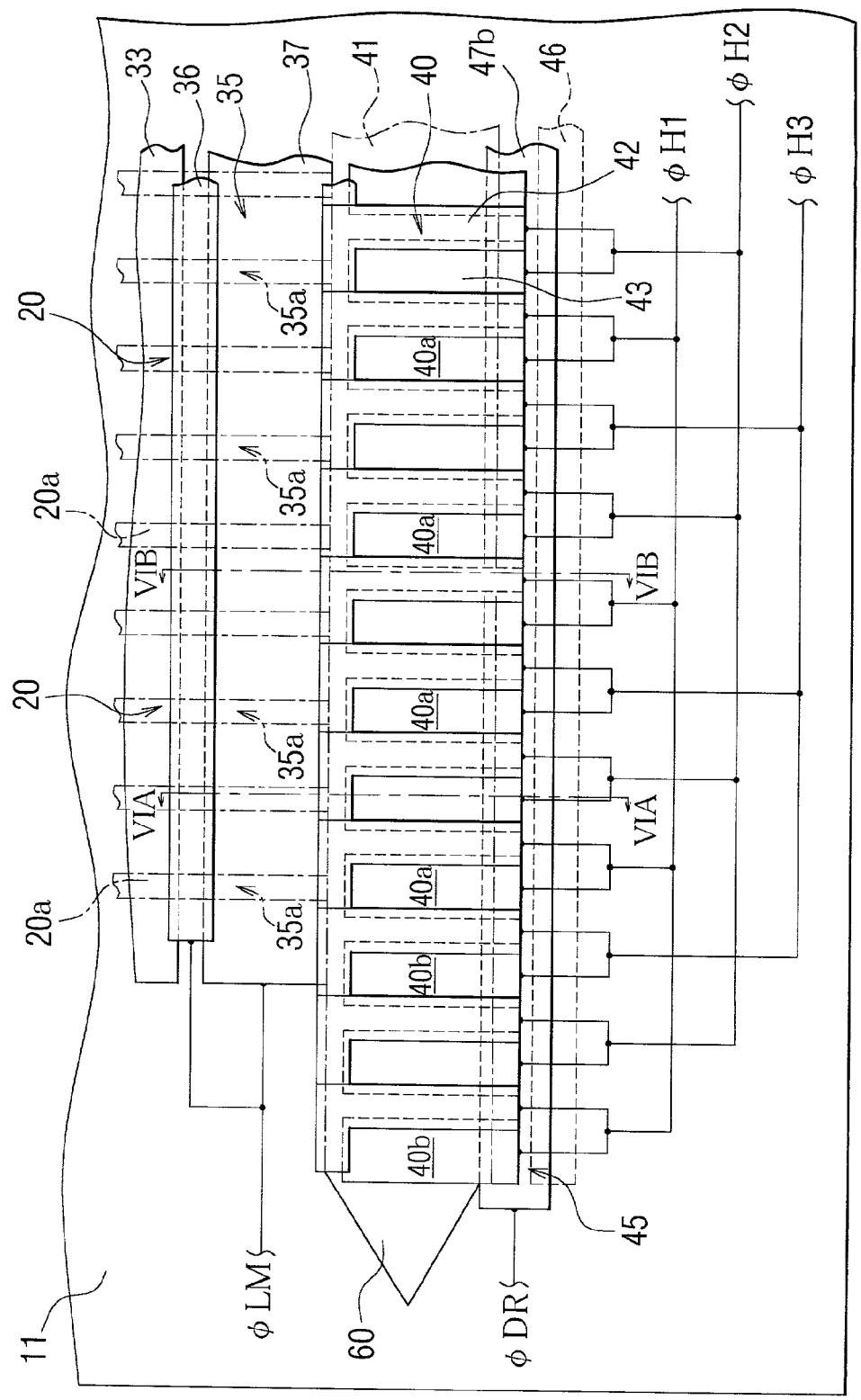
FIG. 5 is a schematic diagram showing a magnified image of an area of a CCD line memory section to a discharge drain in the CCD image sensor of the first embodiment.
Figure 6A:
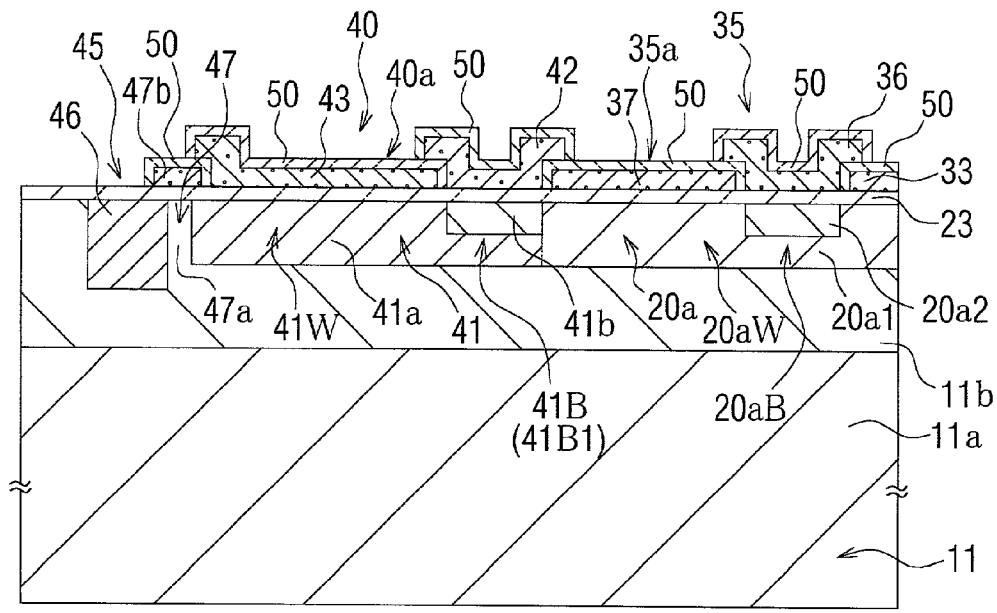
FIG. 6A is a cross-sectional view schematically showing a cross section along line VIA—VIA of FIG. 5.
Figure 6B:
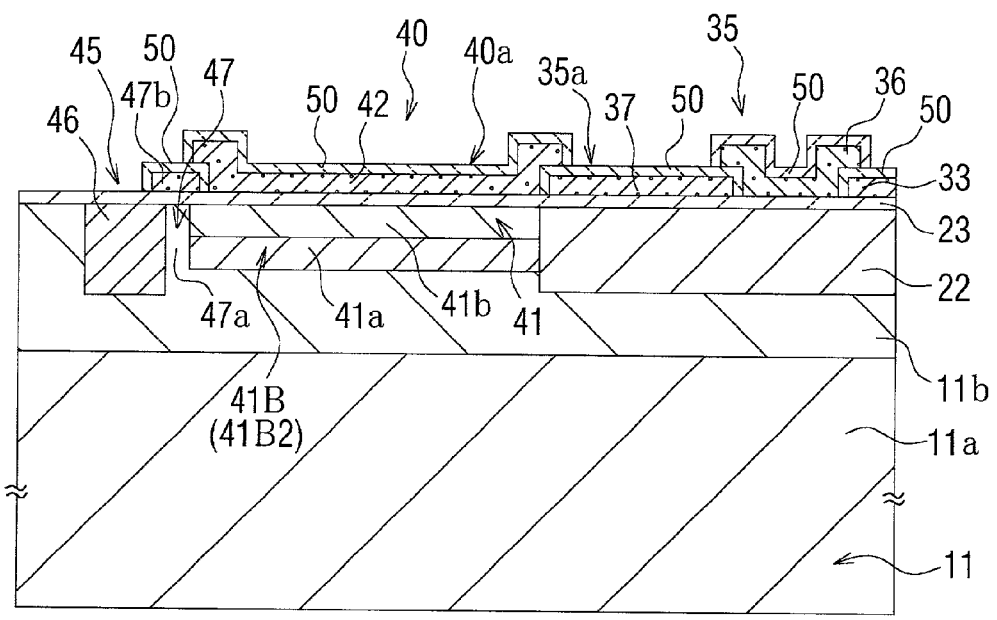
FIG. 6B is a cross-sectional view schematically showing a cross section along line VIB—VIB of FIG. 5.

Referring next to FIGS. 5, 6A, and 6B, description will be given in detail of the structures respectively of the CCD line memory section 35, the horizontal charge transfer device 40, and the discharge drain 45.

FIG. 5 shows a magnified view of a region ranging from the CCD line memory section 35 to the discharge drain 45.

FIG. 6A schematically shows a cross section along line VIA—VIA of FIG. 5 and FIG. 6B schematically shows a cross section along line VIB—VIB of FIG. 5.

As shown in FIG. 5 or 6A, the downstream end section of each vertical charge transfer channel 20a comes into contact with a horizontal charge transfer channel 41.

As shown in FIG. 6A, each vertical charge transfer channel 20a in the CCD line memory section 35 includes one potential barrier region 20aB including an n-type impurity doped region (n-type channel) 20a1 on which a p⁻-type impurity doped region 20a2 is formed and one potential well region 20aW including only the n-type impurity doped region (n-type channel) 20a1.

Width of the potential barrier region 20aB (width in the direction of the photoelectric converter column) is, for example, from about 0.5 μm to about 1 μm. Width of the potential well region 20aW (width in the direction of the photoelectric converter column) is, for example, from about 2 μm to about 20 μm. Both regions 20aB and 20aW have conductivity type of n-type as charge transfer channels.

The first transfer control electrode 36 is disposed over the potential barrier region 20aB with the insulating layer 23 therebetween. The second transfer control electrode 37 is disposed over the potential well region 20aW with the insulating layer 23 therebetween. For example, the second transfer control electrode 37 is formed using a first polycrystalline silicon layer and the first transfer control electrode 36 is formed using a second polycrystalline silicon layer.

Each transfer control stage 35a includes one potential barrier region 20aB, a first transfer control electrode 36 thereover, one potential well region 20aW, and a second transfer control electrode 37 thereover.

The first and second transfer control electrodes 36 and 37 are commonly connected to each other and receive a control signal φLM. When potential of the potential barrier region 20aB is increased by controlling the level of the control signal φLM, charge can be transferred from the vertical charge transfer device 20 to the transfer control stage 35a. When potential of the potential well region 20aW is decreased by controlling the level of the control signal φLM, charge can be transferred from the transfer control stage 35a to the horizontal charge transfer device 40.

The charge transfer from the transfer control stage 35a to the horizontal charge transfer device 40 will be described later in detail by referring to FIG. 9.

As shown in FIG. 5, the horizontal charge transfer device 40 includes one horizontal charge transfer channel 41 having a contour of a band extending in the direction of the photoelectric converter row and includes many pairs each of which includes the first and second horizontal transfer electrodes 42 and 43 formed on the channel 41.

As shown in FIGS. 6A and 6B, the horizontal charge transfer channel 41 includes a potential barrier region 41B including an n-type impurity doped region (n-type channel) 41a on which a p⁻-type impurity doped region 41b is formed and a potential well region 41W including only the n-type impurity doped region (n-type channel) 41a. Both regions 41B and 41W have conductivity type of n-type as charge transfer channels.

The potential barrier region 41B includes one first barrier region 41B1 having a contour of a band extending in the direction of the photoelectric converter row and many second barrier regions 41B2 each of which branches from the first barrier region 41B1 at a constant interval therebetween and each of which has a contour of a band extending in the direction of the photoelectric converter column. Between one second barrier region 41B2 and one succeeding second barrier region 41 B2 at a downstream position of the preceding second barrier region 41B2, one potential well region 41W is formed to be adjacent to the preceding and succeeding second barrier regions 41B2. One potential well region 41W is formed also on a downstream side of the most downstream second barrier region 41B2.

The first barrier region 4181 separates the transfer control stage 35a from the potential well region 41W in the horizontal charge transfer device 40. Each second barrier regions 41B2 separates the potential well regions 41W from each other in the horizontal charge transfer device 40.

Each first horizontal transfer electrode 42 covers one second barrier region 41B2 and one first barrier region 41B1 following the second barrier regions 41B2. The first horizontal transfer electrode 42 has a contour of reversed L-shape in a plan view (FIG. 5).

Each second horizontal transfer electrode 43 covers one potential well region 41W. The second horizontal transfer electrode 43 has a contour of a rectangle in a plan view (FIG. 5).

The first and second horizontal transfer electrodes 42 and 43 are formed on the semiconductor substrate 11 with the insulating layer 23 therebetween. The second horizontal transfer electrode 43 is formed using, for example, a second polycrystalline silicon layer and the first horizontal transfer electrode 42 is formed using, for example, a third polycrystalline silicon layer.

One first horizontal transfer electrode 42, the potential barrier region 41B therebelow, associated one second horizontal transfer electrode 43, and the potential well region 41W therebelow constitute one horizontal charge transfer stage 40a or one subordinate horizontal charge transfer stage 40b. The horizontal charge transfer stages 40a correspond to the associated vertical charge transfer channels 20a and are aligned in one line. Three subordinate horizontal charge transfer stages 40b are formed on a downstream side (on the side of the output section 60, which will be described later) of the horizontal charge transfer stage 40a corresponding to the left-most vertical charge transfer channel 20a in FIG. 5.

The first and second horizontal transfer electrodes 42 and 43 constituting one horizontal charge transfer stage 40a or one subordinate horizontal charge transfer stage 40b are commonly connected to each other and receive the horizontal driving signal φH1, φH2, or φH3.

To transfer charge from the transfer control stage 35a to the horizontal charge transfer device 40, the signal levels respectively of the control signal φLM and the horizontal driving signals φH1, φH2, φH3 are controlled, for example, as below. That is, potential of the potential barrier region 41B in the horizontal charge transfer stage 40a is relatively higher than potential of the potential well region 20aW in the transfer control stage 35a. This allows the transfer of charge from the transfer control stage 35a to the horizontal charge transfer device 40. The principle of the charge transfer from the transfer control stage 35a to the horizontal charge transfer device 40 will be described later in detail by referring to FIG. 9.

To transfer charge through the horizontal charge transfer device 40, the signal levels respectively of the horizontal driving signals φH1, φH2, and φH3 are controlled, for example, as below. That is, potential of the potential well region 41W of the horizontal charge transfer stage 40a to which charge is distributed is relatively lower than potential of the potential barrier region 41B of the horizontal charge transfer stage 40a immediately at a downstream position of the potential well region 41W.

As shown in FIG. 5, 6A, or 6B, the discharge drain 45 includes a drain region 46 extending in the direction of the photoelectric converter row. The drain region 46 is made of, for example, a band-shaped n⁺-type impurity doped region formed in the p-type impurity doped region 11b of the semiconductor substrate 11.

A discharge drain channel region 47a (FIG. 6A or 6B) is interposed between the drain region 46 and the horizontal charge transfer channel 41. The discharge drain channel region 47a is made of, for example, a portion of the p-type impurity doped region 11b and extends in the direction of the photoelectric converter row.

A discharge gate electrode 47b covers the discharge drain channel region 47a in a plan view. The discharge gate electrode 47b is formed on the insulating layer 23 using, for example, a first polycrystalline silicon layer. The discharge drain channel region 47a and the discharge gate electrode 47b constitute the discharge gate 47.

The discharge gate electrode 47b receives the control signal φDR. When the voltage of the control signal φDR is, for example, about 15 volt (V) to about 20 V, an inversion layer is formed in the vicinity of a surface of the discharge drain channel region 47a, and a conducting state is establish between the horizontal charge transfer channel 41 and the drain region 46. Therefore, charge can be discharged from the horizontal charge transfer stages and the subordinate horizontal charge transfer stages to the drain region 46. The principle of the charge transfer from the horizontal charge transfer device 40 to the discharge drain 45 will be described later in detail by referring to FIG. 9.

Each of the horizontal transfer electrodes 42 and 43 and the discharge gate electrode 47b is coated with the insulating layer (thermal oxidation layer) 50 (FIG. 6a or 6B) in a respective way. As shown in FIG. 6B, a channel stop region 22 is arranged in the periphery of each vertical charge transfer channel 20a in plan view, excepting the region between the vertical charge transfer channel 20a and the adjacent horizontal charge transfer channel 41.

The CCD image sensor 10a constituted as above operates in response to driving signals and control signals supplied from the driving circuit 65 (FIG. 1).

FIG. 4 also shows a wiring example to drive the vertical charge transfer devices 20 by four-phase vertical driving signals φV1 to φV4. FIG. 5 similarly shows a wiring example to drive the horizontal charge transfer device 40 by three-phase horizontal driving signals φH1 to φH3. FIGS. 4 and 5 also show a wiring example in which the CCD line memory section 35 is driven by the control signal φLM and the discharge drain 45 is driven by the control signal φDR.

As shown in FIG. 4, the first and second vertical transfer electrodes 25 and 26 and the first to third subordinate transfer electrodes 31 to 33 are respectively classified into four groups for the four-phase driving of the vertical charge transfer devices 20. The vertical driving signals φV1 to φ4 are respectively supplied to the groups. Each group includes every fourth one of the first vertical transfer electrodes 25, a second vertical transfer electrode 26, the first subordinate transfer electrode 31, the second subordinate transfer electrode 32, or the third subordinate transfer electrode 33.

As shown in FIG. 5, the horizontal charge transfer stages and the subordinate horizontal charge transfer stages are classified into three groups for the three-phase driving of the horizontal charge transfer device 40. Each group includes an every third one of the horizontal charge transfer stages and an subordinate horizontal charge transfer stage relative to the most downstream subordinate horizontal charge transfer stage.

The horizontal driving signals φH1 to φH3 are supplied to the irst, second, and third groups, respectively. In the example of FIG. 5, the horizontal driving signals φH1 to φH3 are supplied to the most downstream subordinate horizontal charge transfer stage, the second most downstream subordinate horizontal charge transfer stage, and the most upstream subordinate horizontal charge transfer stage, namely, the third most downstream subordinate horizontal charge transfer stage, respectively.

As shown in FIGS. 4 and 5, the control signal φLM is supplied to the set of the first and second transfer control electrodes 36 and 37. The control signal φDR is supplied to the discharge gate electrode 47b.

In this specification, the number of horizontal transfer electrodes of the horizontal charge transfer device after a point thereof connected to voltage supply wirings to supply the driving signals is obtained as follows.

A plurality of successive horizontal transfer electrodes connected to one voltage supply wiring line are collectively regarded and are counted as one horizontal transfer electrode. Therefore, two adjacent horizontal transfer electrodes connected respectively to different voltage supply wiring lines are counted as two horizontal transfer electrodes. Two non-adjacent horizontal transfer electrodes connected to one voltage supply wiring line are counted as two horizontal transfer electrodes.

The counting rule also applies to the case below, namely, to the counting of the transfer electrodes in a charge transfer apparatus. The charge transfer apparatus includes a plurality of first charge transfer channel regions (for example, the downstream-side edge sections of the respective vertical charge transfer channels 20a) and a charge transfer device (for example, the horizontal charge transfer device 40) including a second charge transfer channel electrically connected to the respective first charge transfer channel regions, and a plurality of transfer electrodes formed on the second charge transfer channel with an electrically insulating layer therebetween. The rule applies to the case when each of the transfer electrodes is connected to predetermined voltage supply wiring line. The rule also applies to the counting of the transfer control electrodes of the CCD line memory section.

According to the rule, the horizontal charge transfer device 40 includes one horizontal transfer electrode for each horizontal charge transfer stage 40a and for each subordinate horizontal charge transfer stage 40b. The horizontal charge transfer device 40 includes horizontal transfer electrodes classified into a plurality of groups each of which includes three successive horizontal transfer electrodes. Three horizontal transfer electrodes constituting one group are connected mutually different voltage supply lines, respectively. The horizontal transfer electrodes are connected with a period of three horizontal transfer electrodes to one voltage supply line, that is, every third horizontal transfer electrodes are connected to one voltage supply line.

In the CCD image pickup system 100 (FIG. 1), the driving signals φV1 to φV4, the control signal φLM, and the driving signals φH1 to φH3 respectively having predetermined waveforms are supplied from the driving circuit 65 to the CCD image sensor 10 according to its shooting or operation mode, namely, the still picture recording mode or the monitor mode. Each vertical charge transfer device 20, the CCD line memory section 35, and the horizontal charge transfer device 40 operate according to the operation mode of the CCD image pickup system 100.

Description will now be given of an example of operation of each vertical charge transfer device 20, the CCD line memory section 35, the horizontal charge transfer device 40, and the discharge drain 45 when the operation mode is set to the monitor mode in the CCD image pickup system 100.

When the CCD image pickup system 100 is in the monitor mode, each vertical charge transfer device 20 operates, for example, for a ½ thin-out scanning. Unnecessary charges are discharged from the CCD line memory section 35 via the horizontal charge transfer device 40 to the discharge drain 45.

When each vertical charge transfer device 20 operates for the ½ thin-out scanning, charges are read from, for example, every second photoelectric converter rows. That is, charges are transferred from the pertinent photoelectric converters to the associated vertical charge transfer devices 20. In the operation, a readout pulse is superpositioned onto the vertical driving signal φV1, or φV3.

The charges stored in each vertical charge transfer device 20 are sequentially transferred through the vertical charge transfer devices 20 and reach the transfer control stages 35a of the CCD line memory section 35. The charges which are read from the photoelectric converters of one photoelectric converter row and which are stored in the respective vertical charge transfer devices 20 reach the transfer control stages 35a at the same timing.

Figure 7:
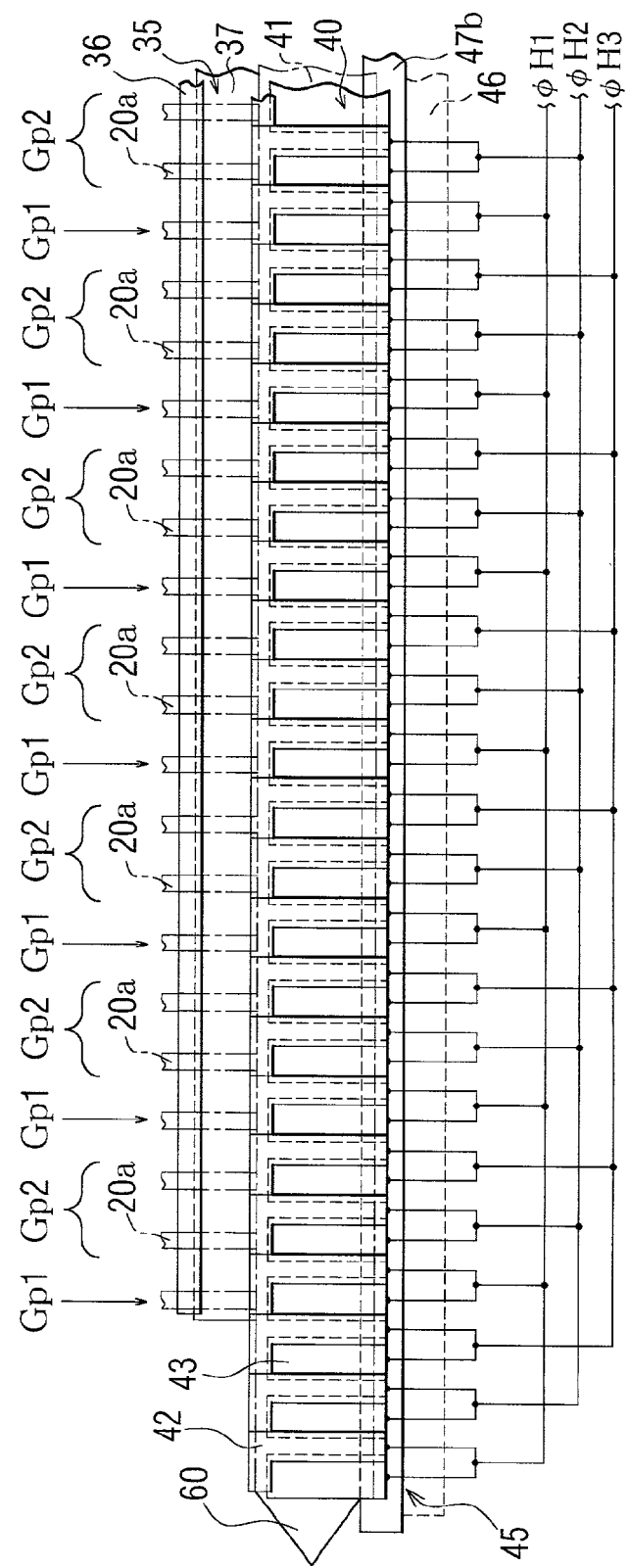
FIG. 7 is a partial plan view showing one specification of the grouping of the vertical charge transfer channels in an operation to selectively discharge unnecessary charges from the horizontal charge transfer device to the discharge drain.

As shown in FIG. 7, the vertical charge transfer channels 20a are classified into two groups in the monitor mode, namely, a first group Gp1 to transfer necessary charges and a second group to transfer unnecessary charges. The first group Gp1 includes the vertical charge transfer channels 20a corresponding to the horizontal charge transfer stages supplied with the horizontal driving signal φH1. The second group Gp2 includes the vertical charge transfer channels 20a corresponding to the horizontal charge transfer stages supplied with the horizontal driving signal φH2 or φH3.

The constituent components of FIG. 7 have already been shown in FIG. 5, and hence the same reference numerals are also assigned thereto and description thereof will be avoided.

Referring now to FIGS. 8, 9, 10A, and 10B, description will be given of a charge transfer method in which unnecessary charges are first discharged via the horizontal charge transfer device 40 to the discharge drain 45, necessary charges are next transferred to the device 40, and then the necessary charges are transferred therefrom to the output section 60.

In the description below, the charge transferred via each vertical charge transfer channel 20a will be referred to as "charge g1", "charge r", "charge g2", and "charge b" respectively corresponding to the colors of the color filters disposed over the photoelectric converters 15 corresponding to the vertical charge transfer channel 20a. Each vertical charge transfer channel 20a of the first group Gp1 transfers charge g1 or charge b. Each vertical charge transfer channel 20a of the second group Gp2 transfers charge r or charge g2.

Figure 8:
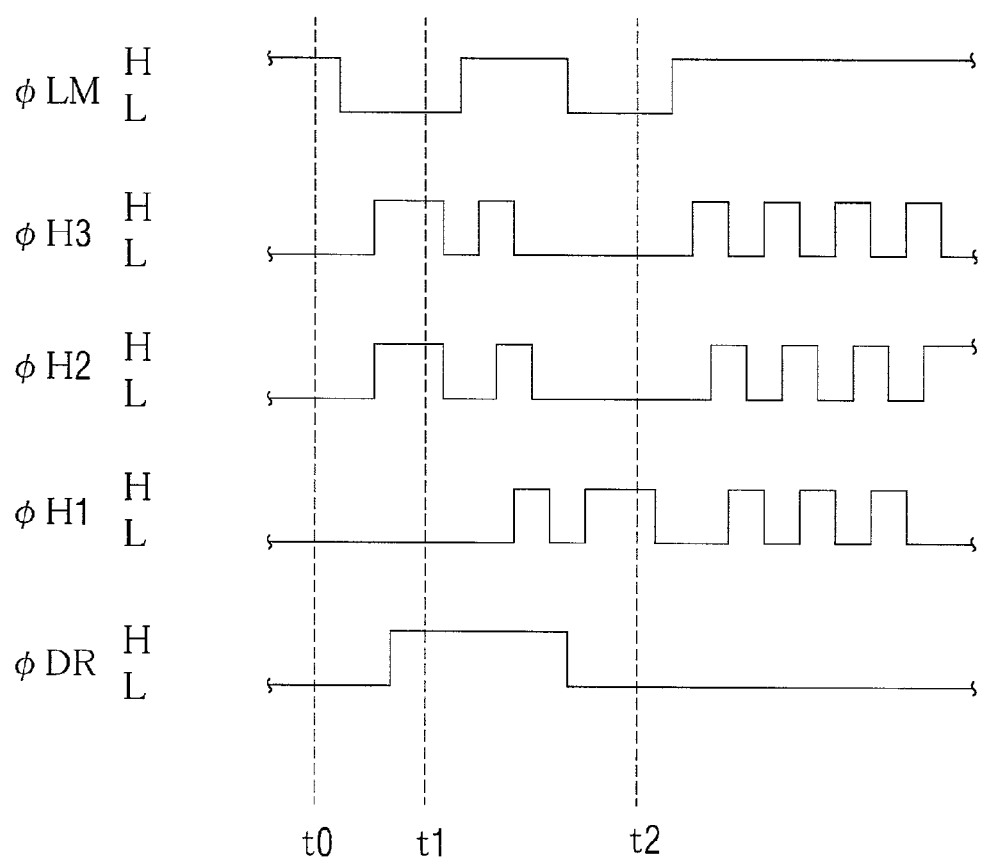
FIG. 8 is a signal timing chart showing an example of a control signal φLM, horizontal driving signals φH1 to φH8, and a control signal φDR to respectively drive the CCD line memory section, the horizontal charge transfer device, and the discharge drain in the CCD image sensor of the first embodiment.

FIG. 8 shows an example of waveforms of the control signal φLM, the horizontal driving signals φH1 to φH3, and the control signal φDR used to transfer necessary charges from the CCD line memory section 35 to the output section 60.

Figure 9:
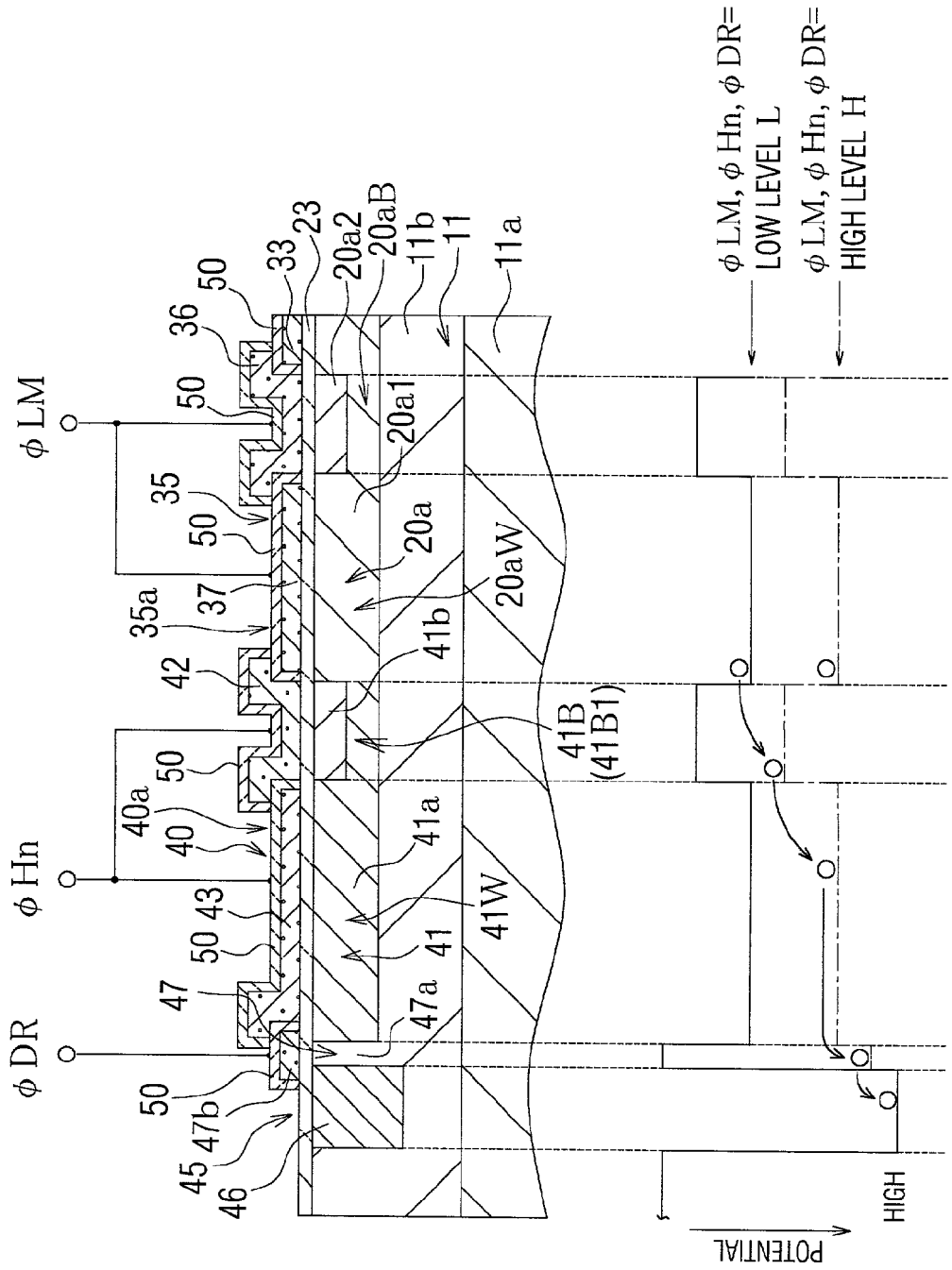
FIG. 9 is a diagram schematically showing a principle of operation to transfer charges from the CCD line memory section to the horizontal charge transfer device and a principle of operation to transfer charges from the CCD line memory section via the horizontal charge transfer device to the discharge drain in the CCD image sensor of the first embodiment.

FIG. 9 schematically shows the principle of operation in which charges are transferred from the CCD line memory section 35 to the horizontal charge transfer device 40 and charges are transferred from the CCD line memory section 35 via the horizontal charge transfer device 40 to the discharge drain 45.

Figure 10A:
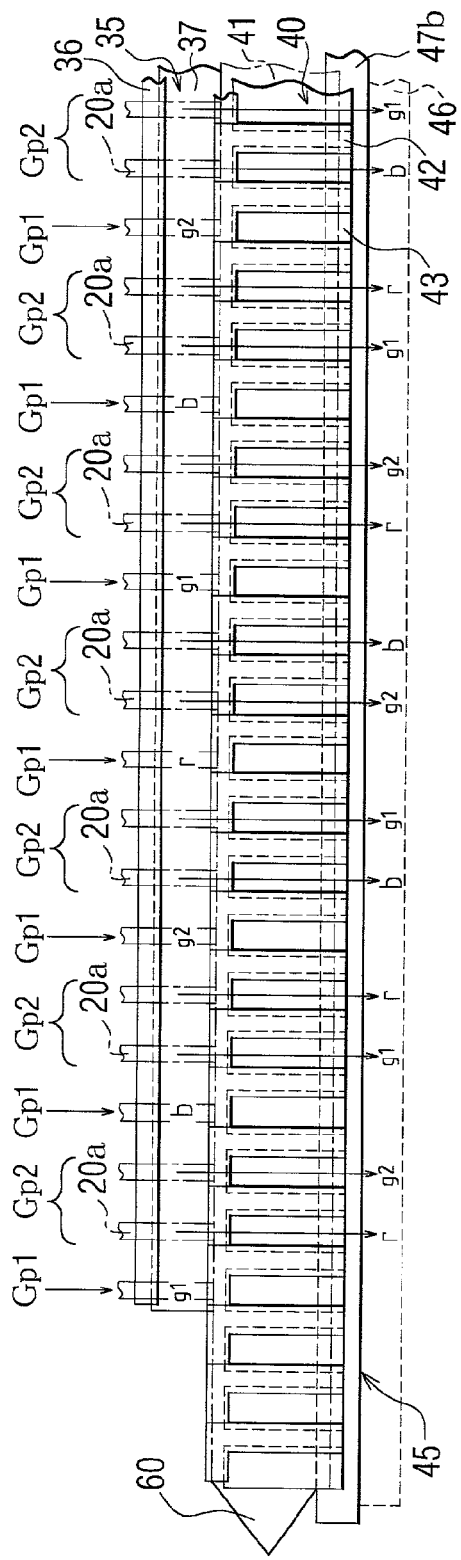
FIG. 10A is a schematic diagram showing a state of a charges distribution at time t1 of FIG. 8A.
Figure 10B:
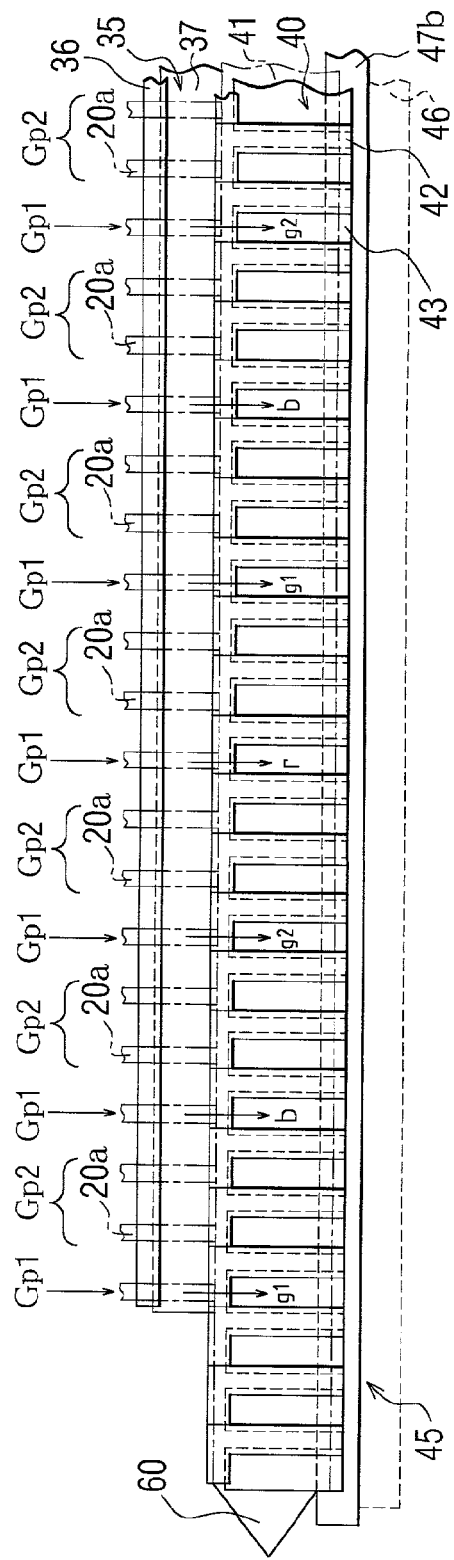
FIG. 10B is a schematic diagram showing a state of a charges distribution at time t2 of FIG. 8A.

FIGS. 10A and 10B schematically show states of charges distribution respectively at time t1 and time t2 of FIG. 8.

The constituent components of FIGS. 9, 10A, and 10B have already been shown in FIG. 6A or 7, and hence the same reference numerals are also assigned thereto and description thereof will be avoided.

As shown in FIG. 8, at time t0 before the charges are transferred from the CCD line memory section 35 to the horizontal charge transfer device 40, the horizontal driving signals φH1 to φH3 are at a low level L, e.g., 0 V and the control signal φLM is at a high level H, e.g., +3.3 V.

As shown in FIG. 9, when the horizontal driving signal φHn (n is an optional integer of 1, 2, or 3) is at a low level L, potential of the horizontal charge transfer channel 46 (the potential barrier region 41 B) below the first horizontal transfer electrode 42 is lower than potential of the vertical charge transfer channel 20a (the potential well region 20aW) below the second transfer control electrode 37 regardless of the high level H or the low level L of the control signal φLM. Therefore, when the horizontal driving signal φHn is at a low level L, charge indicated by a small circle in FIG. 9 is not transferred from the CCD line memory section 35 via the horizontal charge transfer device 40, namely, remains in the CCD line memory section 35.

Consequently, the charges are not transferred from the CCD line memory section 35 to the horizontal charge transfer device 40 at time t0 of FIG. 8.

To transfer unnecessary charges from the CCD line memory section 35 to the horizontal charge transfer device 40 as in the case at time t1 of FIG. 8, the control signal φLM is changed from the high level H to the low level L, e.g., 0 V. The horizontal driving signal φH1 is set to the low level L and the horizontal driving signals φH2 and φH3 are set to the high level H. Moreover, the control signal φR is set to the high level H, e.g., to a voltage ranging from 15 V to 20 V.

As shown in FIG. 9, when the horizontal driving signal φHn is at a high level H and the control signal φLM is at a low level L, potential of the horizontal charge transfer channel 46 (the potential barrier region 41B) below the first horizontal transfer electrode 42 is higher than potential of the vertical charge transfer channel 20a (the potential well region 20aW) below the second transfer control electrode 37. Therefore, charge indicated by a small circle is transferred from the CCD line memory section 35 to the horizontal charge transfer device 40.

In this situation, when the control signal φDR is at a low level L, e.g., 5 V, an inversion layer is not formed in the vicinity of a surface of the discharge gate channel region 47a. Potential of the region 47a is less than potential of the horizontal charge transfer channel 41 (the potential well region 41W) below the second horizontal transfer electrode 43. A conducting state is not set between the horizontal charge transfer channel 40a and the drain region 46. The charge indicated by a small circle is not discharged to the drain region 46, namely, remains in the horizontal charge transfer device 40.

On the other hand, when the control signal (PDR is at a high level H, an inversion layer is formed in the vicinity of a surface of the discharge gate channel region 47a. The potential of the region 47a becomes more than that of the horizontal charge transfer channel 41 (the potential well region 41W) below the second horizontal transfer electrode 43. The horizontal charge transfer stage 40a and the drain region 46 are set to a conducting state. The charge indicated by a small circle is discharged from the horizontal charge transfer device 40 to the discharge drain 45 (the drain region 46).

Therefore, at time t1 of FIG. 8, charges are transferred from the CCD line memory section 35 to the respective horizontal charge transfer stages being supplied with the horizontal driving signal φH2 or φH3. The charges are then discharged to the discharge drain 45.

FIG. 10A shows a state of distribution of charges g1, r, g2, and b at time t1 of FIG. 8. Unnecessary charges r and g2 are transferred from the respective vertical charge transfer channels 20a of the second group Gp2 to the respective horizontal charge transfer stages being supplied with the horizontal driving signal φH2 or φH3. The unnecessary charges r and g2 are then discharged to the discharge drain 45. In FIG. 10A, the transfer courses of the unnecessary charges are indicated by arrow marks.

Charges are not transferred from the CCD line memory section 35 to the horizontal charge transfer stages being supplied with the horizontal driving signal φH1. That is, the necessary charges are not transferred from the vertical charge transfer channels 20a of the first group Gp1 to the horizontal charge transfer device 40.

Next, as shown in FIG. 8, the horizontal driving signals φH2 and φH3 are changed from the high level H to a low level L. Subsequently, the control signal φLM is changed from the low level L to a high level H to prevent the charges transfer from the CCD line memory section 35 to the horizontal charge transfer device 40.

Thereafter, while keeping the control signal φDR at the high level H, the horizontal driving signals φH3, φH2, and φH1 are sequentially changed in this sequence from the low level L to a high level H. During a period of time in which the horizontal driving signal φH2 is at the high level H, the horizontal driving signal φH3 is restored from the high level H to the low level L. During a period of time in which the horizontal driving signal φH1 is at the high level H, the horizontal driving signal φH2 is restored from the high level H to the low level L. The horizontal driving signal φH1 is restored to the low level L after a lapse of a certain period of time. The sequence of operations corresponds to operation to transfer each charge in the horizontal charge transfer device 40 for one horizontal charge transfer stage in the downstream direction.

Even when there exists horizontal charge transfer stage which cannot fully discharge unnecessary charge to the discharge drain 45, unnecessary charge can be discharged from other horizontal charge transfer stage to the discharge drain 45 by the transfer operation. The unnecessary charges can be discharged from horizontal charge transfer stages to the discharge drain 45 with a high probability.

After the horizontal driving signal φH1 is restored from the high level H to the low level L, the control signal φLM is changed from the high level H to the low level L. Moreover, the control signal φDR is changed from the high level H to the low level L to prevent the charges discharge from the horizontal charge transfer device 40 to the discharge drain 45.

Thereafter, as in the operation at time t2 of FIG. 8, only the horizontal driving signal φH1 is restored to the high level H. The control signals φLM and φDR are at a low level L. Therefore, charges are transferred from the CCD line memory 35 to the respective horizontal charge transfer stages being supplied with the horizontal driving signal φH1.

FIG. 10B shows a state of distribution of charges g1, r, g2, and b at time t2 of FIG. 8. Necessary charges g1, r, g2, or b are transferred from the respective vertical charge transfer channels 20a of the first group Gp1 to the respective horizontal charge transfer stages being supplied with the horizontal driving signal φH1. The necessary charges are not discharged to the discharge drain 45, namely, remains in the horizontal charge transfer device 40.

Next, the horizontal driving signal φH1 is changed from the high level H to the low level L and the control signal φLM is changed from the low level L to the high level H to prevent the charge transfer from the CCD line memory section 35 to the horizontal charge transfer device 40. Thereafter, the horizontal driving signals φH3, φH2, and φH1 are repetitiously changed in this sequence from the low level L to the high level H and then vice versa.

Resultantly, charges g1, b, g2, r in the horizontal charge transfer device 40 are sequentially transferred in the transfer step of one horizontal charge transfer stage or one subordinate horizontal charge transfer stage toward the output section 60 in the stage-by-stage way.

By controlling the CCD line memory section 35, the horizontal charge transfer device 40, and the discharge drain 45 in this way, unnecessary charges selected from the charges stored in the respective vertical charge transfer devices 20 can be discharged to the discharge drain 45. Therefore, only the necessary charges are transferred via the horizontal charge transfer device 40 to the output section 60. The charges of which the contents are thinned out to one third of those of the original charges are transferred from the horizontal charge transfer device 40 to the output section 60.

Having received the charges (necessary charges) from the horizontal charge transfer device 40, the output section 60 sequentially outputs image signals (signal voltages) according to the received charges (necessary charges). The video signal proceeding circuit 70 of FIG. 1 generates image data using the image signals (the signal voltages). The image data generated by the video signal proceeding circuit 70 is sent to the image data output section 75 to be once stored on a storage medium such as a frame memory. Thereafter, the image data output section 75 sends the image data to the display section 80, which displays an image thereon.

The CCD image pickup system 100 including the CCD image sensor 10a of the first embodiment discharges the unnecessary charges to the discharge drain 45 and hence can generate the image data only using the necessary charges.

Consequently, desired charges can be easily thinned out in the photoelectric converters low and column directions to produce image data in which desired numbers respectively of the vertical and horizontal pixels are thinned out from the original pixels. When compared with a case in which only the number of vertical pixels is reduced by thinning out pixels to display an image on the monitor, a better image can be easily displayed on the monitor. A mobile picture as well as a still picture can be displayed on the monitor. Naturally, desired charges can be thinned out only in the photoelectric converter row direction to produce image data in which the number of horizontal pixels is reduced.

The quantity of charges transferred from the horizontal charge transfer device 40 to the output section 60 is reduced to one third of the original quantity, which leads to the advantages as below.

As compared with the horizontal charge transfer device of the prior art in which charges are received from all vertical charge transfer devices and are transferred to the output section, the length of one horizontal readout period is reduced to about one third if the data rate is kept unchanged. Therefore, the frame frequency can be increased to about three times the frame frequency of the prior art in the monitor display operation, and hence a more natural image can be easily displayed. When the image is displayed on the monitor with the frame frequency of the prior art, the data rate becomes about one third, and hence the driving frequency of the horizontal charge transfer device can be reduced to about one third of the prior art. As a result, the driving power consumed by the horizontal charge transfer device which is a primary power consumer of the CCD image pickup system can be reduced to about one third of the prior art.

On the other hand, when the CCD image pickup system 100 is in the still picture record mode, the respective vertical charge transfer devices 20 are driven, for example, for the interlaced scanning. Charges read from one photoelectric converter row into the respective vertical charge transfer devices 20 are transferred up to the CCD line memory section 35 at the same timing. The addition (mixing) in the vertical charge transfer device is not performed for the charges.

In the still picture record mode, the respective vertical charge transfer channels 20a are classified into three groups, i.e., first to third groups. Charges are transferred from the CCD line memory section 35 to the horizontal charge transfer device 40 at mutually different timing respectively for the first, second, and third groups. Each group includes every third vertical charge transfer channels 20a.

First, charges are transferred from each vertical charge transfer channel 20a of one group to, for example, each horizontal charge transfer stage being supplied with the horizontal driving signal φH1. After the charges are completely transferred from the horizontal charge transfer device 40 to the output section 60, charges are transferred from each vertical charge transfer channel 20a of another group to, for example, each horizontal charge transfer stage being supplied with the horizontal driving signal φH2. After the charges are completely transferred from the horizontal charge transfer device 40 to the output section 60, charges are transferred from each vertical charge transfer channel 20a of the last group to, for example, each horizontal charge transfer stage being supplied with the horizontal driving signal φH3. The charges are further transferred to the output section 60. The charge is not discharged from the horizontal charge transfer device 40 to the discharge drain 45.

The charges transfer from the CCD line memory section 35 to the horizontal charge transfer device 40 (the horizontal charge transfer stages) is performed according to the principle already described in conjunction with FIG. 9.

In the charges transfer through the horizontal charge transfer device 40, the horizontal driving signals φH1 to φH3 are repeatedly changed from the low level L to the high level H and vice versa in a predetermined sequence and with predetermined phases.

The output section 60 sequentially outputs image signals (signal voltages) according to the charges received from the horizontal charge transfer device 40. The video signal proceeding circuit 70 of FIG. 1 generates image data of a still picture using the image signals (signal voltages). The image data generated by the video signal proceeding circuit 70 is sent to the image data output section 75 to be once stored on a storage medium such as a frame memory.

Thereafter, the image data is supplied from the image data output section 75 to the display section 80, and a still picture is displayed on the display section. Or, the image data is supplied from the image data output section 75 to the recording section 82, and the image data of a still picture is recorded on a recording medium such as a memory card. The CCD image pickup system 100 generates image data of a still picture according to charges stored in the photoelectric converters 15.

Naturally, in the still picture record mode, desired charges can be thinned out only in either one or both of the row and the column of the photoelectric converters to produce image data in which the number of the vertical pixels or the horizontal pixels is reduced or in which the numbers respectively of the vertical pixels and the horizontal pixels are reduced.

When the horizontal charge transfer device 40 is driven by 6-phase horizontal driving signals φH1 to φH6, the vertical charge transfer channels 20a can be classified into two groups and charges can be transferred from the vertical charge transfer channels 20a to the horizontal charge transfer device 40 at mutually different timing for the respective groups. Each group includes, for example, every second vertical charge transfer channels 20a.

When the horizontal charge transfer device 40 is driven by 4-phase horizontal driving signals φH1 to φH4, the quantity of charges can be reduced to one half of the original quantity of charges by thinning out charges in the photoelectric converter row direction, and the resultant charges are transferred to the output section 60.

FIG. 11 shows a wiring example to supply 4-phase horizontal driving signals φH1 to φH4 to the horizontal charge transfer device 40 so that one half of the charges are thinned out in the photoelectric converter row direction and the resultant charges are transferred to the output section 60. FIG. 11 also shows wirings which supply the control signal φLM to the CCD line memory section 35 and the control signal φDR to the discharge drain 45.

The horizontal driving signal φH1 is supplied to the horizontal charge transfer stage corresponding to the left-most vertical charge transfer channel 20a of FIG. 11, every eighth horizontal charge transfer stages on the right side of the horizontal charge transfer stage, the horizontal charge transfer stage corresponding to the third left-most vertical charge transfer channel 20a, and every eighth horizontal charge transfer stages on the right side of the horizontal charge transfer stage.

The horizontal driving signal φH2 is supplied to the horizontal charge transfer stage corresponding to the second left-most vertical charge transfer channel 20a, every eighth horizontal charge transfer stages on the right side of the horizontal charge transfer stage, the horizontal charge transfer stage corresponding to the fourth left-most vertical charge transfer channel 20a, and every eighth horizontal charge transfer stages on the right side of the horizontal charge transfer stage.

The horizontal driving signal φH3 is supplied to the horizontal charge transfer stage corresponding to the fifth left-most vertical charge transfer channel 20a, every eighth horizontal charge transfer stages on the right side of the horizontal charge transfer stage, the horizontal charge transfer stage corresponding to the seventh left-most vertical charge transfer channel 20a, and every eighth horizontal charge transfer stages on the right side of the horizontal charge transfer stage. The signal φH3 is also supplied to the second left-most subordinate horizontal charge transfer stage.

The horizontal driving signal φH4 is supplied to the horizontal charge transfer stage corresponding to the sixth left-most vertical charge transfer channel 20a, every eighth horizontal charge transfer stages on the right side of the horizontal charge transfer stage, the horizontal charge transfer stage corresponding to the eighth left-most vertical charge transfer channel 20a, and every eighth horizontal charge transfer stages on the right side of the horizontal charge transfer stage. The signal φH4 is also supplied to the left-most subordinate horizontal charge transfer stage and third-most subordinate horizontal charge transfer stage.

In the example of FIG. 11, a first group Gp1 includes the vertical charge transfer channels 20a respectively corresponding to the horizontal charge transfer stages supplied with the horizontal driving signal φH1. A second group Gp2 includes the vertical charge transfer channels 20a respectively corresponding to the horizontal charge transfer stages supplied with the horizontal driving signal φH2. A third group Gp3 includes the vertical charge transfer channels 20a respectively corresponding to the horizontal charge transfer stages supplied respectively with the horizontal driving signal φH3 or φH4.

The vertical charge transfer channels 20a of the first and second groups Gp1 and Gp2 transfer necessary charges. The vertical charge transfer channels 20a of the third group Gp3 transfer unnecessary charges.

Figure 12:
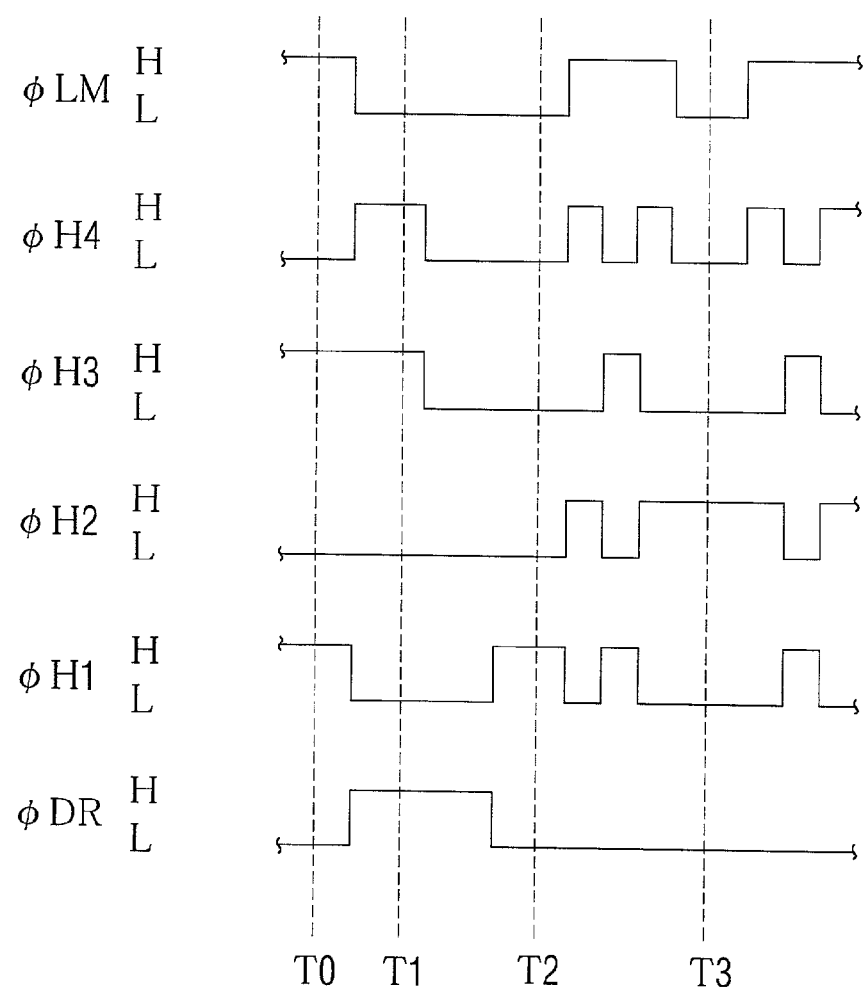
FIG. 12 is a signal timing chart showing another example of a control signal ELM, horizontal driving signals φH1 to φH8, and a control signal φDR to respectively drive the CCD line memory section, the horizontal charge transfer device, and the discharge drain in the CCD image sensor of the first embodiment.

FIG. 12 shows an example of waveforms of the control signal φLM, the horizontal driving signals φH1 to φH4, and the control signal φDR in an operation in which after the unnecessary charges are discharged to the discharge drain 45 the necessary charges are transferred to the output section 60.

Figure 14:
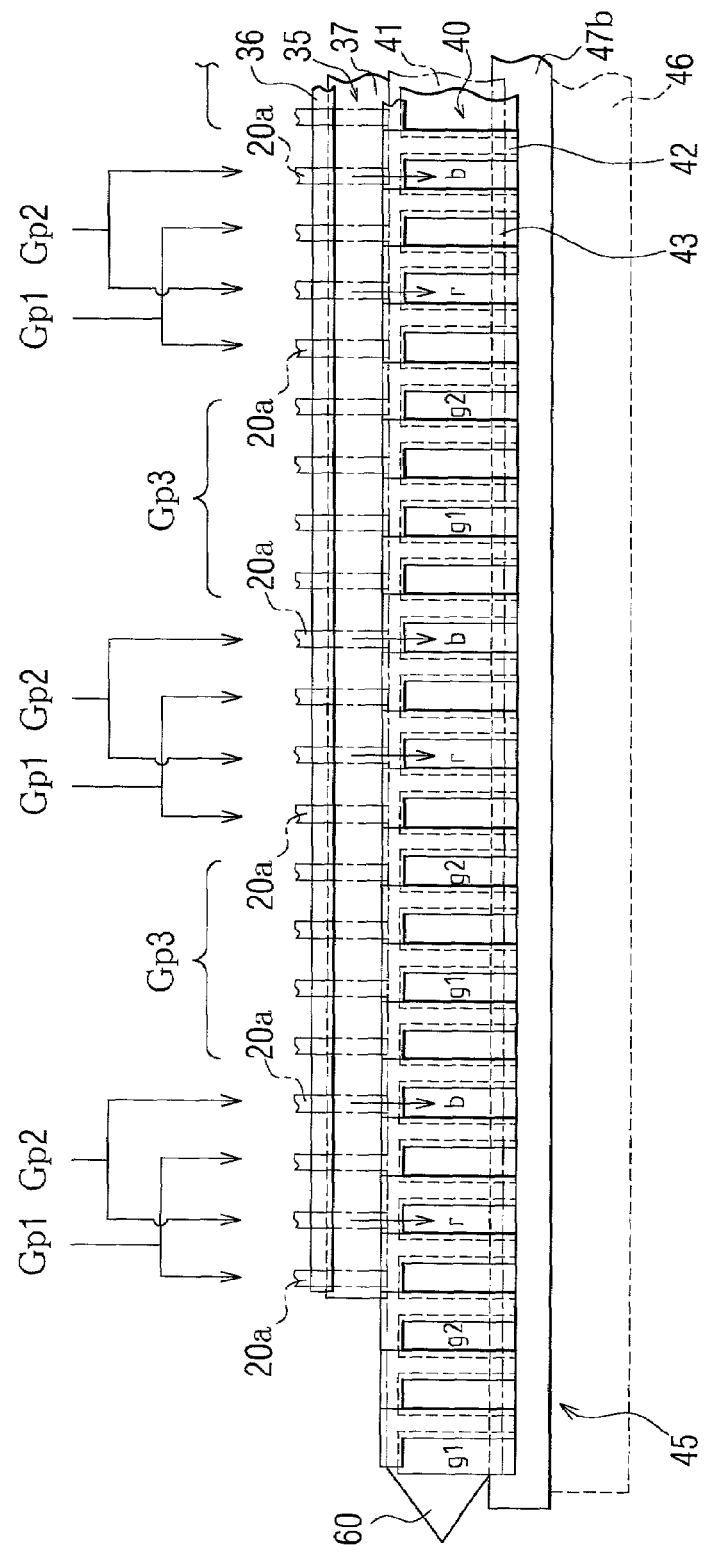
FIG. 14 is a schematic diagram showing a state of a charges distribution at time T3 of FIG. 12.

FIGS. 13A, 13B, and 14 schematically show states of distribution of charges at the points of time T1, T2, and T3 of FIG. 12.

As shown in FIG. 12, at time T0 before charges are transferred from the CCD line memory section 35 to the horizontal charge transfer device 40, the horizontal driving signals φH2 and φH4 and the control signal φDR are at a low level L and the horizontal driving signals φH1 and φH3 and the control signal φLM are at a high level H.

Since the control signal φLM is at a high level H, the charges transfer from the CCD line memory section 35 to the horizontal charge transfer device 40 is prevented.

As in the case at time T1 of FIG. 12, to transfer unnecessary charges from the CCD line memory section 35 to the horizontal charge transfer device 40, the control signal φLM is changed from the high level H to the low level L. The horizontal driving signals φH1 and φH2 are set to the low level L and the horizontal driving signals φH3 and φH4 are set to the high level H. Moreover, the control signal φDR is set to the high level H.

Since the control signal φLM is at the low level L and the signals φH3 and φH4 of the horizontal driving signals φH1 to φH4 are at the high level H, charges are transferred from the CCD line memory section 35 to the respective horizontal charge transfer stages being supplied with the horizontal driving signal φH3 or φH4. That is, the unnecessary charges are transferred from the vertical charge transfer channels 20a of the third group Gp3 to the horizontal charge transfer device 40.

Since the control signal φDR is at the high level H, the unnecessary charges transferred to the horizontal charge transfer device 40 are then discharged therefrom to the discharge drain 45.

FIG. 13A shows a state of distribution of charges g1, r, g2, and b at time T1 of FIG. 12. Unnecessary charges g1, r, g2, and b are transferred from the vertical charge transfer channels 20a of the third group Gp3 to the horizontal charge transfer stages being supplied with the horizontal driving signal φH3 or φH4. The unnecessary charges g1, r, g2, and b are further discharged to the discharge drain 45. In FIG. 12, the transfer courses of the unnecessary charges are indicated by arrow marks. Charge is not transferred from the CCD line memory section 35 to the horizontal charge transfer stages being supplied with the horizontal driving signal φH1 or φH2. That is, the necessary charges are not transferred from the vertical charge transfer channels 20a of the first and second groups Gp1 and Gp2 to the horizontal charge transfer device 40.

Next, as shown in FIG. 12, the horizontal driving signals φH3 and φH4 are changed from the high level H to the low level L. The control signal φDR is then changed from the high level H to the low level L to prevent the charges transfer from the CCD line memory section 35 to the horizontal charge transfer device 40. At timing synchronized with the level change of the control signal φR to the low level L or at timing slightly alter the level change, the horizontal driving signal φH1 is changed from the low level L to the high level H.

As in the case at time T2 of FIG. 12, only the horizontal driving signal φH1 is at the high level H and the horizontal driving signals φH2 to φH4 and the control signals φLM and φDR are at the low level L. Charges are transferred from the vertical charge transfer channels 20a corresponding to the horizontal charge transfer stages being supplied with the horizontal driving signal φH1 to the horizontal charge transfer device 40. That is, the necessary charges are transferred from the vertical charge transfer channels 20a of the first group Gp1 to the horizontal charge transfer device 40.

FIG. 13B shows a state of distribution of charges g1, r, g2, and b at time T2 of FIG. 12. Necessary charges g1 or g2 is transferred from the horizontal charge transfer channels 20a of the first group Gp1 to the horizontal charge transfer stages being supplied with the horizontal driving signal φH1. The necessary charges g1 and g2 are not discharged to the discharge drain 45, namely, remains in the horizontal charge transfer device 40. In FIG. 12, the transfer courses of the necessary charges gl and g2 are indicated by arrow marks.

Charges are not transferred from the CCD line memory section 35 to the horizontal charge transfer stages being supplied with the horizontal driving signal φH2. That is, the necessary charges are not transferred from the vertical charge transfer channels 20a of the second group Gp2 to the horizontal charge transfer device 40.

Next, as shown in FIG. 12, the control signal φLM is then changed from the low level L to the high level H to prevent the charges transfer from the CCD line memory section 35 to the horizontal charge transfer device 40. The horizontal driving signal φH4 is set to the high level H and the horizontal driving signal φH1 is set to the low level L. The horizontal driving signal φH2 is set to the high level H. The horizontal driving signal φH3 is at the low level L. The necessary charges g1 or g2 distributed to the horizontal charge transfer stages being supplied with the horizontal driving signal φH1 are transferred in the downstream direction for one horizontal charge transfer stage to the next horizontal charge transfer stages.

Subsequently, the horizontal driving signal φH1 is set to the high level H and the horizontal driving signal φH2 is set to the low level L. The horizontal driving signal φH3 is set to the high level H and the horizontal driving signal φH4 is set to the low level L. The necessary charges g1 or g2 distributed to the horizontal charge transfer stages being supplied with the horizontal driving signal φH2 or φH4 are transferred in the downstream direction for one horizontal charge transfer stage to the next horizontal charge transfer stages.

Furthermore, the horizontal driving signal φH4 is set to the high level H and the horizontal driving signal φH1 is set to the low level L. The horizontal driving signal φH2 is set to the high level H and the horizontal driving signal φH3 is set to the low level L. The necessary charges g1 or g2 distributed to the horizontal charge transfer stages being supplied with the horizontal driving signal φH1 or φH3 are transferred in the downstream direction for one horizontal charge transfer stage to the next horizontal charge transfer stages.

Thereafter, as in the case at time T3 of FIG. 12, the control signal φLM is changed from the high level H to the low level L. In this situation, the control signal φDR is at a low level L to prevent the charges transfer from the CCD line memory section 35 to the horizontal charge transfer device 40. The horizontal driving signal φH2 is at the high level H and the horizontal driving signals φH1, φH3, and φH4 are at the low level L. Charges are transferred from the vertical charge transfer channels 20a corresponding to the horizontal charge transfer stages being supplied with the horizontal driving signal φH2 to the horizontal charge transfer device 40. That is, the necessary charges are transferred from the vertical charge transfer channels 20a of the second group Gp2 to the horizontal charge transfer device 40.

FIG. 14 shows a distribution state of charges g1, r, g2, and b at time T3 of FIG. 12. The necessary charges r or b are transferred from the vertical charge transfer channels 20a of the second group Gp2 to the horizontal charge transfer stages being supplied with the horizontal driving signal φH2. The necessary charges r or b are not discharged to the discharge drain 45, namely, remains in the horizontal charge transfer device 40. In FIG. 14, the transfer courses of the necessary charges r and b are indicated by arrow marks.

In the horizontal charge transfer device 40 in this state, the necessary charges are distributed to every second charge transfer stages beginning at the most downstream subordinate horizontal charge transfer stage. As shown in FIG. 14, the necessary charges g1, g2, r, and b are repeatedly distributed in this sequence beginning at the most downstream subordinate horizontal charge transfer stage.

Thereafter, as shown in FIG. 12, the control signal φLM is changed from the low level L to the high level H to inhibit the charges transfer from the CCD line memory section 35 to the horizontal charge transfer device 40. Assume that the horizontal driving signals φH1 and φH3 constitute a first set and the horizontal driving signals φH2 and φH4 constitute a second set. Each set is repeatedly changed from the low level L to the high level H and vice versa. In the operation, the phase of either one of the first and second sets is shifted 180° from that of the other one thereof. The first set including the horizontal driving signal φH1 is first set to the low level L.

Resultantly, the necessary charges g1, g2, r, and b in the horizontal charge transfer device 40 are sequentially transferred to the output section 60.

By controlling the CCD line memory section 35, the horizontal charge transfer device 40, and the discharge drain 45 in this way, one half of charges are thinned out in each photoelectric converter row and resultant charges are transferred from the horizontal charge transfer device 40 to the output section 60.

Also in this case, as in the case in which the horizontal charge transfer device 40 is driven by 3-phase horizontal driving signals, desired charge can be thinned out in the photoelectric converter column direction. It is possible to easily produce an image data in which pixels are thinned out in either one or both of the vertical and horizontal direction. Therefore, image data in which pixels are thinned out in both of the vertical and horizontal direction can be easily produced. When compared with a case in which only vertical pixels are thinned out to display an image on the monitor, a better image can be easily displayed on the monitor. A mobile picture as well as a still picture can be displayed on the monitor.

For the same reason as for the case in which the horizontal charge transfer device 40 is driven by 3-phase horizontal driving signals, the frame frequency can be increased to about two times the prior art in the monitor display operation, and hence a more natural image can be easily displayed. When the image is displayed on the monitor with the frame frequency of the prior art, the data rate becomes about one half. Therefore, the driving frequency of the horizontal charge transfer device can be reduced to about one half of the prior art. As a result, the driving power consumed by the horizontal charge transfer device which is a primary power consumer of the CCD image pickup system can be reduced to about one half of the prior art.

On the other hand, when the CCD image pickup system 100 is in the still picture record mode, the respective vertical charge transfer devices 20 are driven, for example, for the interlaced scanning. Charges read from one photoelectric converter row into each vertical charge transfer device 20 are transferred up to the CCD line memory section 35 at the same timing. Also in the still picture record mode, the respective vertical charge transfer devices 20 are classified into two groups, i.e., first and second groups. Charges are transferred from the CCD line memory section 35 to the horizontal charge transfer device 40 at mutually different timing respectively for the first and second groups. Each group includes every second vertical charge transfer channels 20a.

First, charges are transferred, for example, from each vertical charge transfer channels 20a of the first group to the horizontal charge transfer device 40. After the charges are completely transferred from the horizontal charge transfer device 40 to the output section 60, charges are transferred from each vertical charge transfer channels 20a of the second group to the horizontal charge transfer device 40. The charges are further transferred to the output section 60.

The charges transfer from the CCD line memory section 35 to the horizontal charge transfer device 40 is performed according to the principle already described in conjunction with FIG. 9.

In the charges transfer through the horizontal charge transfer device 40, the horizontal driving signals φH1 to φH4 are repeatedly changed from the low level L to the high level H and vice versa in a predetermined sequence and with predetermined phases.

The output section 60 sequentially outputs image signals (signal voltages) according to the charges received from the horizontal charge transfer device 40. The video signal proceeding circuit 70 of FIG. 1 generates image data of a still picture using the image signals (signal voltages). The image data generated by the video signal proceeding circuit 70 is sent to the image data output section 75 to be once stored on a storage medium such as a frame memory.

Thereafter, the image data is supplied from the image data output section 75 to the display section 80, and a still picture is displayed on the display section 80. Or, the image data is supplied from the image data output section 75 to the recording section 82 and the image data of a still picture is recorded on a recording medium such as a memory card. The CCD image pickup system 100 generates image data of a still picture according to charges stored in the photoelectric converters 15.

Naturally, in the still picture record mode, desired charges can be thinned out in either one or both of the row direction and the column direction of the photoelectric converters to produce image data in which the number of the vertical pixels or the horizontal pixels is reduced or in which the numbers respectively of the vertical pixels and the horizontal pixels are reduced.

Next, description will be given of a CCD image sensor 10b in an embodiment of the CCD image sensor 10 of FIG. 1.

Figure 15:
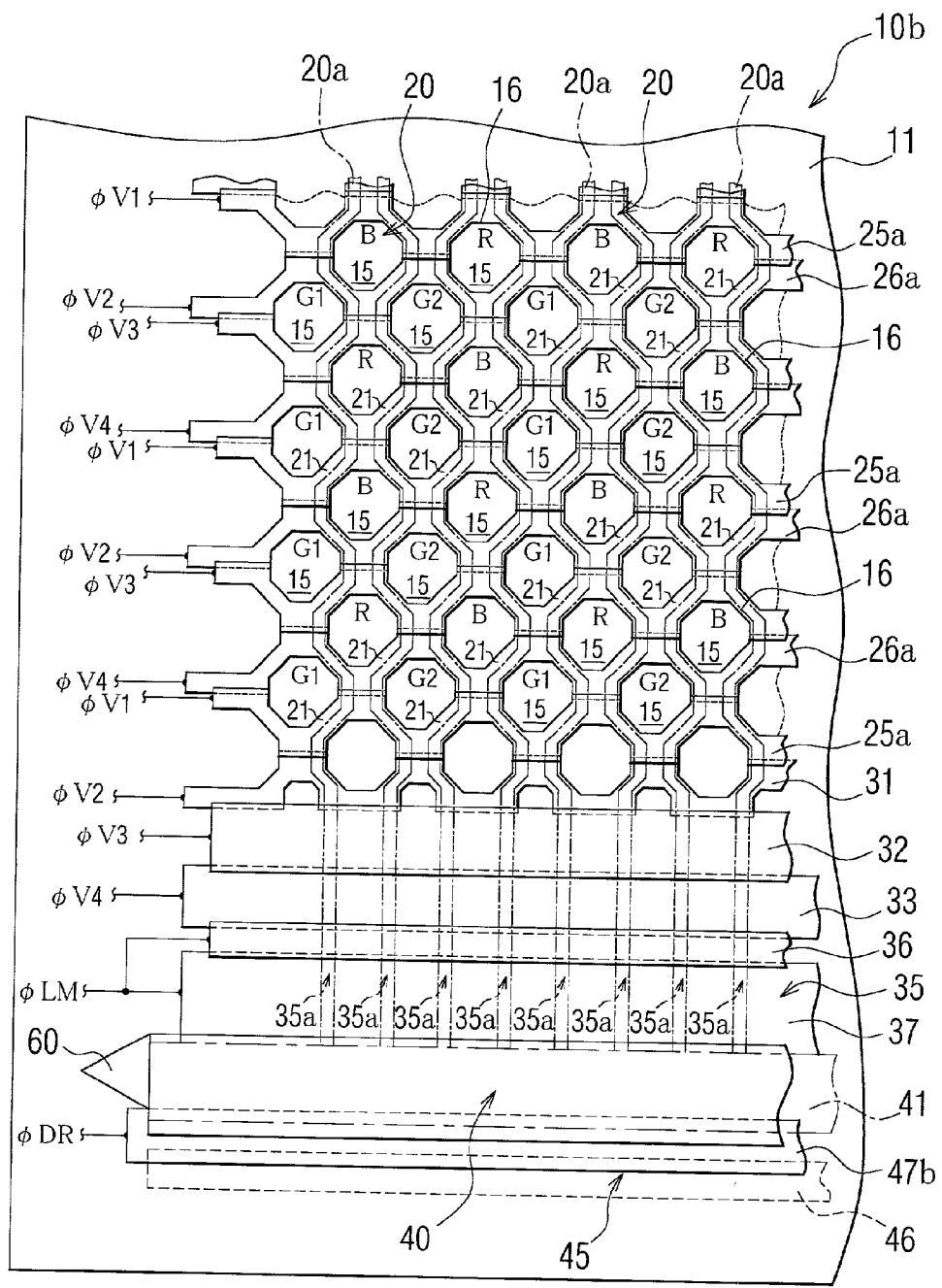
FIG. 15 is a partial plan view schematically showing a layout of the photoelectric converters, the vertical charge transfer devices, the CCD line memory section, the horizontal charge transfer device, the discharge drain, and an output section of the CCD image sensor of the second embodiment.

FIG. 15 is a partial plan view schematically showing a layout of the photoelectric converters, the vertical charge transfer devices, the CCD line memory section, the horizontal charge transfer device, the discharge drain, and the output section of the CCD image sensor 10b in the second embodiment.

As shown in FIG. 15, a large number of photoelectric converters 15 are disposed in a shifted-pixel layout in the CCD image sensor 10b. The sensor 10b considerably differs in this point from the CCD image sensor 10a of the first embodiment.

Also in points (1) to (7) below, the CCD image sensor 10b differs from the CCD image sensor 10a.

(1) Each photoelectric converter 15 and each photoelectric converter region 16 have an octagonal contour in a plan view.

(2) Each vertical charge transfer channel 20a includes a region which meanders along an associated photoelectric converter column. In association therewith, each vertical charge transfer device 20 includes a region which meanders along an associated photoelectric converter column.

(3) One readout gate channel region is disposed along a lower-right edge of each photoelectric converter 15 in a plan view.

(4) Excepting a first vertical transfer electrode 25a at a most downstream position, each first vertical transfer electrode 25a includes a region which meanders between and along an even photoelectric converter row relative to the horizontal charge transfer device 40 and an odd photoelectric converter at an immediate downstream position of the even photoelectric converter row. The first vertical transfer electrode 25a at the most downstream position includes a region which meanders on a downstream side of and along a first photoelectric converter row relative to the horizontal charge transfer device 40.

(5) Excepting a second vertical transfer electrode 26a at a most upstream position, each second vertical transfer electrode 26a includes a region which meanders between and along an odd photoelectric converter row relative to the horizontal charge transfer device 40 and an even photoelectric converter at an immediate downstream position of the odd photoelectric converter row. The second vertical transfer electrode 26a at the most upstream position includes a region which meanders on an upstream side of and along a photoelectric converter row at a most upstream position.

(6) Each first vertical transfer electrode 25a constitutes all readout gates 21 corresponding respectively to the photoelectric converters in the odd photoelectric converter row corresponding to this first vertical transfer electrode 25a. Each second vertical transfer electrode 26a constitutes all readout gates 21 corresponding respectively to the photoelectric converters in the even photoelectric converter row corresponding to this second vertical transfer electrode 26a.

(7) A first subordinate transfer electrode 31 meanders and generally extends in the direction of the photoelectric converter row.

Excepting these different points, the CCD image sensor 10b of FIG. 15 is almost equal in structure to the CCD image sensor 10a of the first embodiment.

The constituent components and elements of FIG. 15 functionally common to those of FIG. 4 will be assigned with the same reference numerals, and description thereof will be avoided. However, the first and second vertical transfer electrodes are assigned with new reference numerals 25a and 26a, respectively.

In FIG. 15, the light shielding layer, the protection layer, the first and second planarizing layers, the microlens array are not shown. Although the color filter array itself is not shown, the colors of the color filters disposed on the respective photoelectric converter elements 15 are indicated as symbol G1, G2, R, or B. The symbols G1, G2, R, and B correspond to those of FIG. 4.

In the "shifted-pixel layout" which is one of the advantages of the CCD image sensor 10b of this embodiment, a large number of photoelectric converters are arranged as follows.

The photoelectric converters of the even photoelectric converter columns are respectively shifted in the column direction from those of the odd photoelectric converter columns about one half of the pitch of the photoelectric converters in the respective photoelectric converter columns. The photoelectric converters of the even photoelectric converter rows are respectively shifted in the row direction from those of the odd photoelectric converter rows about one half of the pitch of the photoelectric converters in the respective photoelectric converter rows. Each photoelectric converter column includes the photoelectric converters of only odd or even rows. The shifted-pixel layout is one configuration of a large number of photoelectric converters disposed in a matrix-shape including a plurality of rows and a plurality of columns.

In the description, "about one half of the pitch of the photoelectric converters in the respective photoelectric converter columns" means, in addition to one half thereof, a value which differs from one half thereof due to a factor such as a manufacturing error or a rounding error of a pixel position in the design or in the mask production and which can be regarded as equivalent to one half thereof in consideration of performance and picture quality of the produced CCD image sensor. This also applies to "about one half of the pitch of the photoelectric converters in the respective photoelectric converter rows".

In the CCD image sensor 10b configured as above, the vertical charge transfer devices 20 can be driven, for example, by 4-phase vertical driving signals $\phi V1$ to $\phi V4$ for the ½ thin-out scanning. Wiring for this operation is similar to the wiring example of the CCD image sensor 10a of FIG. 4. FIG. 15 also shows wiring to supply the control signal $\phi LM$ to the CCD line memory section 35 and wiring to supply the control signal $\phi DR$ to the discharge drain 45.

When the vertical charge transfer devices 20 operate for the ½ thin-out scanning, a readout pulse is superpositioned onto each vertical driving signal $\phi V1$ and $\phi V4$ almost at the same time. Charges read into the vertical charge transfer devices 20 are sequentially transferred through vertical charge transfer devices 20 to reach transfer control stages constituting the CCD line memory section 35. Charges read from the photoelectric converters 15 of two adjacent photoelectric converter rows are fed to the vertical charge transfer devices 20. The charges then reach the CCD line memory 35 at the same timing.

Therefore, after this point, image signals in which the numbers of the vertical and horizontal pixel numbers are reduced or thinned out can be easily generated by discharging unnecessary charges to the discharge drain 45 in the similar manner as the discharge operation of the unnecessary charges in the CCD image sensor 10a of the first embodiment and by transferring necessary charges to the output section 60. It is easy to generate an image data in which the numbers of the vertical and horizontal pixel numbers are reduced. When compared with a case in which an image is displayed on a monitor according to image data generated by thinning out only the vertical pixels, a better image can be easily displayed on the monitor. A mobile picture as well as a still picture can be displayed on the monitor. Naturally, it is also possible to generate image data by thinning out the numbers respectively of the vertical pixels and the horizontal pixels.

On the other hand, when the CCD image pickup system 100 is in the still picture record mode, one frame is subdivided into, for example, two fields including first and second fields.

The first field includes, for example, the most downstream photoelectric converter row, every fourth photoelectric converter rows on the upstream side relative to the most downstream photoelectric converter row, the second most downstream photoelectric converter row, and every fourth photoelectric converter rows on the upstream side relative to the second most downstream photoelectric converter row.

The second field includes the third most downstream photoelectric converter row, every fourth photoelectric converter rows on the upstream side relative to the third most downstream photoelectric converter row, the fourth most downstream photoelectric converter row, and every fourth photoelectric converter rows on the upstream side relative to the fourth most downstream photoelectric converter row.

When charges are read from the photoelectric converters of the first field to be stored in the vertical charge transfer devices 20, a readout pulse is superpositioned onto the vertical driving signals $\phi V1$ and $\phi V4$ almost at the same timing. When charges are read from the photoelectric converters of the second field to be stored in the vertical charge transfer devices 20, a readout pulse is superpositioned onto the vertical driving signals φV3 and φV2 almost at the same timing.

The readout and transfer of the charges are performed in the field unit. Charges which are read from two adjacent photoelectric converter rows and which are stored in the vertical charge transfer devices 20 is transferred up to the CCD line memory section 35 at the same timing.

In the still picture record mode, as in the CCD image sensor 10a of the first embodiment, the vertical charge transfer channels 20a are classified into two groups. Charges are transferred from the CCD line memory 35 to the horizontal charge transfer device 40 at different timing for the respective groups.

The charges transfer from the CCD line memory section 35 to the horizontal charge transfer device 40 is performed according to the principle already described in conjunction with FIG. 9. According to necessity, the unnecessary charges are discharged from the horizontal charge transfer device 40 to the discharge drain 45.

The output section 60 sequentially outputs image signals (signal voltages) according to the charges received from the horizontal charge transfer device 40. The video signal proceeding circuit 70 of FIG. 1 generates image data of a still picture using the image signals (signal voltages). The image data generated by the video signal proceeding circuit 70 is sent to the image data output section 75 to be once stored on a storage medium such as a frame memory.

Thereafter, the image data is supplied from the image data output section 75 to the display section 80, and a still picture is displayed on the display section 80. Or, the image data is supplied from the image data output section 75 to the recording section 82 and the image data of a still picture is recorded on a recording medium such as a memory card. The CCD image pickup system 100 generates image data of a still picture according to charges stored in the photoelectric converters 15.

Naturally, in the still picture record mode, desired charges can be thinned out in either one or both of the row direction and the column direction of the photoelectric converters to produce image data in which the number of the vertical pixels or the horizontal pixels is reduced or in which the numbers respectively of the vertical pixels and the horizontal pixels are reduced.

Next, description will be given of a method of discharging to the discharge drain 45 the charges which cause a smear.

As already described in conjunction with FIG. 2, each vertical charge transfer device 20 is covered with the light shielding layer 51. In the design, the light shielding layer 51 prevents light from entering the vertical charge transfer devices 20. However, in an actual case, light slightly enters the vertical charge transfer devices 20. The light incident to the vertical charge transfer device 20 causes a photoelectric conversion to generate noise charges which cause a smear.

Light continuously enters the CCD image sensor 10, for example, during a readout period of a real-time monitor signal of a digital still camera. Therefore, during the readout period, noise charges causing the smear are liable to distribute to the vertical charge transfer stages of each vertical charge transfer devices 20. When charges read from the photoelectric converters 15 are transferred by the vertical charge transfer devices 20 to the horizontal charge transfer device 40, the noise charges are also transferred to the horizontal charge transfer device 40.

Figure 16:
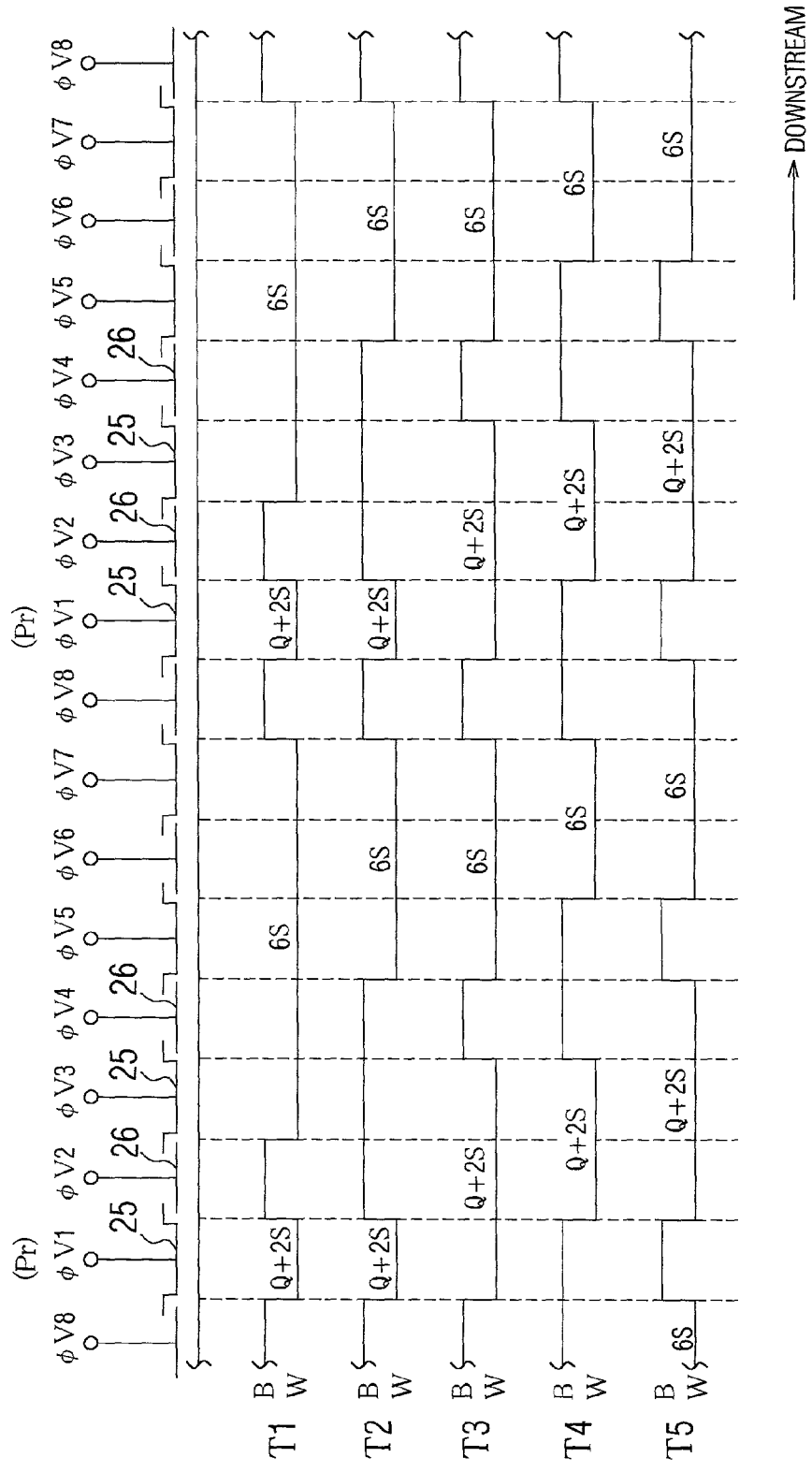
FIG. 16 is a schematic diagram showing a potential level change in each vertical charge transfer stage and kinds of charges distributed to the respective vertical charge transfer stages when each vertical charge transfer device is driven in a low-smear driving mode in the CCD image sensor of the first embodiment.
Figure 17:
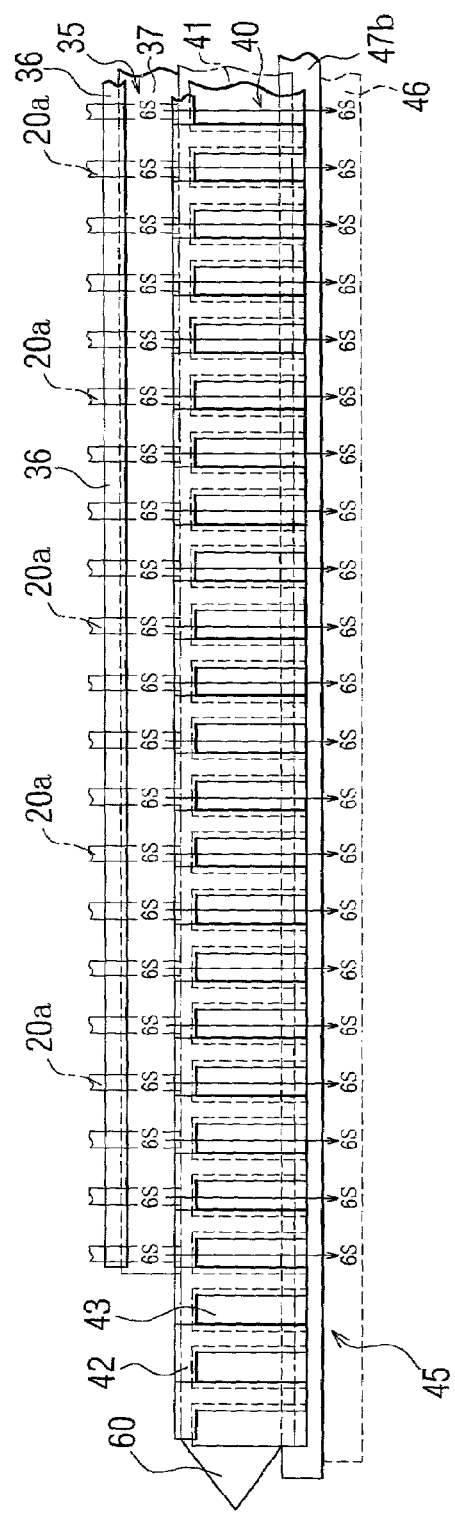
FIG. 17 is a schematic diagram showing a charges distribution state when noise charges are discharged to the discharge drain.

By appropriately driving the vertical charge transfer devices 20, most noise charges can be discharged to the discharge drain 45. Referring next to FIGS. 16 and 17, description will be given of a method (to be referred to as "low-smear driving" herebelow) of driving the vertical charge transfer devices 20 to discharge most noise charges to the discharge drain 45. Assume in the description that new noise charges are not generated after a readout pulse Pr is applied.

FIG. 16 shows a potential level change in each vertical charge transfer stage and kinds of charge distributed to the respective vertical charge transfer stages when each vertical charge transfer device is driven in a low-smear driving mode in the CCD image sensor 10a of the first embodiment. The vertical charge transfer devices 20 are driven by 8-phase vertical driving signals φV1 to φV8 for the ¼ thin-out scanning. The readout pulse Pr is superpositioned onto the vertical driving signal φV1.

FIG. 16 shows the potential level change in each vertical charge transfer stage and the kinds of charge distributed to the respective vertical charge transfer stages during a period of time from T1 when the readout pulse Pr is applied to a predetermined first vertical transfer electrode 25 to a predetermined point of time T5. Charge read from one photoelectric converter 15 is indicated by the symbol Q and noise charge distributed to each vertical charge transfer stage before the application of the readout pulse Pr is indicated by the symbol S.

In the low-smear driving, the vertical driving signals φV1 and φV3 to φV7 are set to a high level. Simultaneously, the vertical driving signals φV2 and φV8 are set to a low level. The potential level of the vertical charge transfer stages supplied respectively with the vertical driving signals φV1 and φV3 to φV7 becomes a level W at which each vertical charge transfer stage functions as a potential well. The potential level of the vertical charge transfer stages supplied respectively with the vertical driving signals φV2 and φV8 becomes a level B at which each vertical charge transfer stage functions as a potential barrier.

When the potential level of a vertical charge transfer stage becomes the level B, noise charge S distributed to this stage moves to a potential well on the upstream or downstream side. However, when potential wells are simultaneously and successively formed on the upstream and downstream sides of the stage, to which one of the potential wells the noise charge S moves cannot be determined. It is assumed for convenience in the description that the noise charge S moves to the potential well on the upstream side.

Next, a readout pulse Pr is superpositioned onto the vertical driving signal φV1 at time T1. Charges Q are read from predetermined photoelectric converters 15 to be fed to the vertical charge transfer stages supplied with the readout pulse Pr, and each charge Q is mixed with two noise charges S including first and second noise charge. The first noise charge is noise charge S beforehand distributed to the vertical charge transfer stage, and the second noise charge is noise charge S transferred from a potential barrier on the downstream side. The resultant charge will be represented by symbol "Q+2S".

In this situation, the vertical charge transfer stages supplied with the vertical driving signals φV3 to φV7 collectively form a potential well which covers five vertical charge transfer stages. In the potential well, six noise charges S are mixed with each other. The resultant noise charge will be represented by symbol "6S". In this connection, a potential well which covers M vertical charge transfer stages (M is an integer equal to or more than one) will be referred to as "M-stage potential well", and a potential barrier which covers M vertical charge transfer stages will be referred to as "M-stage potential barrier".

Subsequently, the vertical driving signals φV3 and φV4 are changed from the high level to the low level at time T2. The respective vertical charge transfer stages supplied with the signal φV3 or φV4 are set to a level B.

Resultantly, each of the upstream edge of the 5-stage potential well moves for two vertical charge transfer stages toward the downstream side and hence becomes a 3-stage potential well. On the other hand, each 1-stage potential barrier on the downstream side of the potential well extends for two vertical charge transfer stages toward the downstream side and hence becomes a 3-stage potential barrier.

Next, the vertical driving signals φV2 and φV3 are changed form the low level to the high level at time T3. The respective vertical charge transfer stage supplied with the signals φV2 and φV3 are set to a level W.

Resultantly, each 1-stage potential well extends for two vertical charge transfer stages toward the downstream side and hence becomes a 3-stage potential well. On the other hand, each of the upstream edge of the 3-stage potential barrier on the downstream side of the potential well moves for two vertical charge transfer stages toward the downstream side and hence becomes a 1-stage potential barrier.

Next, as in the case at time T4, each of the upstream edge of the potential well moves for one vertical charge transfer stage toward the downstream side and becomes a 2-stage potential well. On the other hand, each 1-stage potential barrier on the downstream side of the potential well moves for one vertical charge transfer stage toward the downstream side and becomes a 2-stage potential barrier.

Subsequently, as in the case at time T5, each 2-stage potential well extends for one vertical charge transfer stage toward the downstream side and becomes a 3-stage potential well. On the other hand, each of the upstream edge of the 2-stage potential barrier on the downstream side of the potential well moves for one vertical charge transfer stage toward the downstream side and becomes a 1-stage potential barrier.

By repetitiously conducting the operation at time T4 and at time T5 in this sequence in an alternating way, the noise charges 6S and the charges (Q+2S) can be sequentially transferred toward the downstream side.

As shown in FIG. 17, each noise charge 6S is transferred to the CCD line memory section 35 at the same timing. Therefore, all of the noise charges 6S can be easily discharged at a time via the horizontal charge transfer device 40 to the discharge drain 45.

Image data can be generated only using the charges (Q+2S). Since the amount of noise charges causing the smear is reduced, a more desirable image can be displayed and/or recorded.

Description has been given of embodiments of the CCD image pickup system and the CCD image sensor and the driving methods thereof. However, the present invention is not limited to the embodiments.

For example, in each CCD image sensor of the embodiments, one set of first and second horizontal transfer electrodes is disposed for each horizontal charge transfer stage according to the number of the horizontal transfer electrodes before the horizontal transfer electrodes are connected to voltage supply lines (wiring lines). However, without changing the structure of the horizontal charge transfer channel, the number of the horizontal transfer electrodes before the horizontal transfer electrodes are connected to voltage supply lines can be selected such that one horizontal transfer electrode is disposed for each horizontal charge transfer stage. In this case, the region covered by one first horizontal transfer electrode and one second horizontal transfer electrode is covered by one horizontal transfer electrode. This also applies to the subordinate horizontal charge transfer stage.

The horizontal charge transfer device may also be constituted as a charge transfer device of a type in which an $n^+$-type impurity doped region and an n-type impurity doped region are repeatedly formed in a predetermined pattern on one n-type channel and a predetermined number of transfer electrodes are formed on the n-type channel with an electrically insulating layer therebetween, the insulating layer having substantially constant thickness.

In this case, according to the number of the horizontal transfer electrodes before the horizontal transfer electrodes are connected to voltage supply lines, one horizontal transfer electrode is disposed over each $n^+$-type impurity doped region with an insulating layer therebetween and one horizontal transfer electrode is disposed over each n-type impurity doped region with an insulating layer therebetween. Or, for each set of one $n^+$-type impurity doped region and one n-type impurity doped region adjacent thereto on the upstream side, one horizontal transfer electrode is disposed thereover to cover these regions in a plan view with an insulating layer between the set and the electrode. It is also possible that an n-type impurity doped region is formed in place of the $n^+$-type impurity doped region, and a region including an n-type impurity doped region and a $p^-$-type impurity doped region thereon is formed in place of the n-type impurity doped region.

The horizontal charge transfer device may also be constituted as a charge transfer device of a type in which an electrically insulating layer is formed on one n-type channel having a substantially constant n-type impurity concentration. The insulating layer includes a region (a thick region) having relatively larger thickness and a region (a thin region) having relatively small thickness which are repeatedly formed in a predetermined pattern. A predetermined number of transfer electrodes are formed on the insulating layer.

In this case, according to the number of the horizontal transfer electrodes before the horizontal transfer electrodes are connected to voltage supply lines, one horizontal transfer electrode is disposed on each thick region and each thin region. Or, for each set of one thick region and one thin region adjacent thereto on the upstream side, one horizontal transfer electrode is disposed thereon to cover these regions in a plan view with an insulating layer between the set and the electrode.

Moreover, the horizontal charge transfer device may also be constituted as a charge transfer device of a type in which an electrically insulating layer having substantially constant thickness is formed on one n-type channel having a substantially constant n-type impurity concentration, and a predetermined number of transfer electrodes are formed on the insulating layer.

In this case, by applying a voltage at a relatively higher level to a particular horizontal transfer electrode, a potential well can be formed in one region of the n-type channel below the horizontal transfer electrode. By applying a voltage at a relatively lower level to a particular horizontal transfer electrode, a potential barrier can be formed in one region of the n-type channel below the horizontal transfer electrode.

In each case in which any one of the charge transfer devices of the types described above is used as the horizontal charge transfer device, one horizontal charge transfer stage is formed for one vertical charge transfer device. Each horizontal charge transfer stage includes only one potential barrier region and only one potential well region. The horizontal charge transfer stages corresponding to the vertical charge transfer devices are arranged in a line to be adjacent to each other.

The horizontal transfer electrodes of the horizontal charge transfer device can be classified into a plurality of groups according to the number of the horizontal transfer electrodes connected to voltage supply lines. Each group is constituted of m (m is an integer equal to or more than three) horizontal transfer electrodes continuous in the photoelectric converter row direction. The m horizontal transfer electrodes of each group are respectively connected to mutually different voltage supply lines. The horizontal transfer electrodes are connected to the voltage supply lines with a period of m horizontal transfer electrodes, that is, every m-th horizontal transfer electrodes are connected to one identical voltage supply line. The value of m can be appropriately selected as 3, 4, 6, 7, 8, and so on according to the driving method of the horizontal charge transfer device.

Whether or not the horizontal charge transfer device includes subordinate horizontal charge transfer stages can be appropriately selected depending on cases.

The vertical charge transfer device may be composed without using the subordinate transfer electrode. The driving method of the vertical charge transfer devices is not limited to the driving method for the ½ thin-out scanning and that for the interlaced scanning, but can be appropriately selected from, for example, the driving method for the ⅛ thin-out scanning, that for the ¹⁄₁₆ thin-out scanning, and that for the progressive scanning in accordance with the structure of the vertical charge transfer device, the shooting mode, the presence/absence of vertical addition (mixing), and the like.

The structure of the transfer control stage of the CCD line memory section can also be appropriately selected in the same way as for the horizontal charge transfer device. The transfer control stage can be composed in almost the same way as for the horizontal charge transfer stage of the horizontal charge transfer device.

Figure 18:
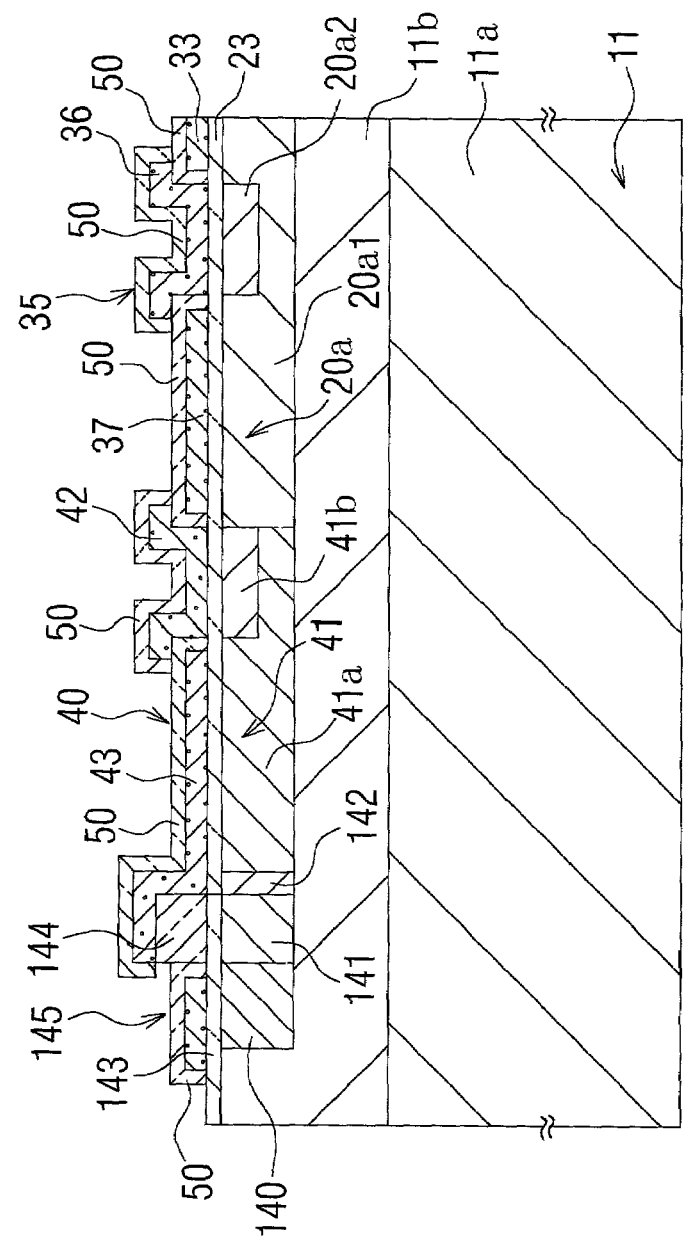
FIG. 18 is a partial cross-sectional view schematically showing a discharge drain of punch through type.

As shown in FIG. 18, the discharge drain can be constructed in a punch through type. The constituent components of FIG. 18 other than the punch-through-type discharge drain 145 have already been shown in FIG. 6A. Therefore, the same constituent components as those of FIG. 6A are assigned with the same reference numerals and description thereof will be avoided.

The punch-through-type discharge drain 145 of FIG. 18 includes a drain region 140 formed in the p-type impurity doped region 11b with a predetermined interval or distance from the horizontal charge transfer channel 41. The drain region 140 is made of an n⁺-type impurity doped region and extends in the photoelectric converter row direction.

An n-type impurity doped region 141 is formed to be adjacent to the drain region 140 on the side of the horizontal charge transfer channel 41. On the side of the horizontal charge transfer channel 41 of the n-type impurity doped region 141, a potential barrier region 142 is disposed to be adjacent to the n-type impurity doped region 141. The potential barrier region 142 is made, for example, of an n⁻-type impurity doped region or a p⁻-type impurity doped region formed at a predetermined position of the p-type impurity doped region 11b. The n-type impurity doped region 141 and the potential barrier region 142 extend in the photoelectric converter row direction. The potential barrier region 142 is also adjacent to the horizontal charge transfer channel 41.

The n-type impurity concentration of the n⁻-type impurity doped region is lower than that of the n-type impurity doped region. The p-type impurity concentration of the p⁻-type impurity doped region is lower than that of the p-type impurity doped region.

A drain electrode 143 is disposed over the drain region 140 with an insulating layer 23 therebetween. The drain electrode 143 is made, for example, of a first polycrystalline silicon layer. An insulating layer (a thermal oxidation layer) 50 covers the drain electrode 143.

An insulating layer 144 is further formed on the n-type impurity doped region 141 with an insulating layer 23 therebetween. The insulating layer 144 is made, for example, of silicon oxide deposited on the insulating layer 23 in a chemical vapor deposition (CVD) process.

Each of the first and second horizontal transfer electrodes 42 and 43 of the horizontal charge transfer device 40 covers, in addition to a predetermined region of the horizontal charge transfer channel 41, the p⁻-type impurity doped region 142 as well as the insulating layer 144. The n-type impurity doped region 141 functions as a potential well region.

When the control signal supplied to the drain electrode 143 is at a low level, the potential of the potential barrier region 142 becomes lower than that of the horizontal charge transfer stages regardless of the low or high level of the horizontal driving signal supplied to each horizontal charge transfer stages of the horizontal charge transfer device 40. Charges in the horizontal charge transfer stages are not discharged to the discharge drain 145, namely, remain therein.

When low-level horizontal driving signals are applied to the horizontal charge transfer stages and a high-level control signal is applied to the drain electrode 143, the potential of the drain region 140 becomes higher. As a result, the potential of the n-type impurity doped region 141 becomes substantially equal to that of the drain region 140, and hence the potential of the potential barrier region 142 also becomes higher. The potential of the potential barrier region 142 becomes higher than that of the horizontal charge transfer stages being supplied with the low-level horizontal driving signals.

As a result, charges distributed to the horizontal charge transfer stages being supplied with the low-level horizontal driving signals are discharged via the potential barrier region 142 and the n-type impurity doped region 141 to the drain region 140. The charge discharged to the drain region 140 is then absorbed in the power source of the control signal of the discharge drain 145.

The structure of the CCD line memory section can also be appropriately selected in the same way as for the horizontal charge transfer device. Basically, it is only necessary that a transfer control stage including one potential barrier region and one potential well region can be formed in the structure.

The driving method of the horizontal charge transfer device is not limited to the driving method to thin out the amount of charges to one half or one third of the original amount in the photoelectric converter row direction. For example, the horizontal charge transfer device can also be driven to thin out the amount of charges to one fourth or less of the original amount in the photoelectric converter row direction. According to necessity, in the horizontal charge transfer device, at least two charges can be added to or mixed with each other. According to the driving method of the horizontal charge transfer device, the number of phases of horizontal driving signals can be appropriately selected as 3, 4, 6, 8, and so on.

The grouping of the vertical charge transfer channels to transfer charges from the CCD line memory section to the horizontal charge transfer device, that is, the determination for each vertical charge transfer channel that charges transferred by the vertical charge transfer channel are necessary charges or unnecessary charges can be appropriately conducted according to, for example, the shooting mode of the CCD image pickup system.

For example, in the color picture shooting mode, each subgroup constituting one vertical charge transfer channel group to transfer necessary charges includes three or four vertical charge transfer channels to transfer necessary kinds of charge to obtain full color information such as three kinds of charges g, r, and b. In the monochrome picture shooting mode, one subgroup may includes only one vertical charge transfer channel.

A CCD image sensor for color pictures desirably includes a light shielding layer. A single-plate CCD image sensor for color pictures includes a color filter array. A microlens array may not be disposed, but is favorably disposed in the CCD sensor.

A CCD image sensor for monochrome pictures may not include the light shielding layer and the microlens array. The color filter array need not be necessarily disposed, but a color filter array of single color may be disposed according to necessity.

The color filter array disposed in the single-plate CCD image sensor for color pictures is not limited to a color filter array having a layout pattern shown in FIG. 3. Moreover, the color filter array is not limited to a color filter array of primary color type, but may be a color filter array of complementary color type.

Known types of color filter layout patterns for the color filter array of primary color type are, so called, a bayer type, an interline type, a G stripe-RB checkered type, a G stripe-RB completely checkered type, a stripe type, an inclined stripe type, and so on. In each type of the color filter array, when the layout pattern is rotated about 40° in a plane, there can be obtained a color filter array of primary color type applicable to a CCD image sensor in which photoelectric converters are arranged in a shifted-pixel layout.

Known types of color filter layout patterns for the color filter array of complementary color type are, so called, a field color-difference sequential type, a frame color-difference sequential type, an MOS type, an improved MOS type, a frame interleaving type, a field interleaving type, a stripe type, and so on. In this type of the color filter array, when the layout pattern is rotated about 40° in a plane, there can be obtained a color filter array of complementary color type applicable to a CCD image sensor in which photoelectric converters are arranged in a shifted-pixel layout.

The CCD image sensor is not limited to the interline transfer type, but may be a full frame type, a frame transfer type, a frame interline transfer type, all pixel readout type, or the like.

It is to be appreciated by those skilled in the art that various changes, modifications, and combinations are possible for those described above.

As above, the present invention provides a charge transfer device capable of thinning out desired charges. By using the charge transfer device as a horizontal charge transfer device in a CCD image sensor, the horizontal charge transfer device can select only desired charges from the charge stored in vertical charge transfer devices to transfer the desired charges to a subsequent device.

A CCD image pickup system including the CCD image sensor can easily produce image data in which the numbers respectively of the vertical and horizontal pixels are thinned out. A CCD image pickup system displaying a better monitor image can be easily provided.

What is claimed is:

1. A charge transfer apparatus, comprising:
    a semiconductor substrate;
    N first charge transfer channel regions of a first conductivity type formed in one surface of the semiconductor substrate;
    a charge transfer device including a first-conductivity-type second charge transfer channel, said second charge transfer channel being formed in said surface of the semiconductor substrate and being electrically connectable to each of said first transfer channel regions,
    said charge transfer device including at least N transfer electrodes formed on said second charge transfer channel with an electrically insulating layer therebetween, said at least N transfer electrodes respectively corresponding to said first charge transfer channel regions in a correspondence in which at least one said transfer electrode is disposed for each said first charge transfer channel region,
    said at least N transfer electrodes being classified into a plurality of groups of which each includes m successive transfer electrodes, m being a positive integer equal to or more than three,
    said m successive transfer electrodes of a group of the plurality of groups being connected to respectively different a voltage supply lines,
    corresponding transfer electrodes of the plurality of groups of m successive transfer electrodes being respectively connected to identical voltage supply lines; and
    a discharge drain including a first-conductivity-type drain region formed in said surface of the semiconductor substrate along said second charge transfer channel, said drain region being electrically connectable to said second charge transfer channel.

2. A charge transfer apparatus according to claim 1 wherein said discharge drain further comprises:
    (a) a second-conductivity-type gate region disposed between said second charge transfer channel and said drain region, said second conductivity type being opposite to said first conductivity type; and
    (b) a discharge gate electrode formed on said gate region with an electrically insulating layer therebetween.

3. A charge transfer apparatus according to claim 1, wherein said discharge drain further comprises:
    (a) a region formed between said second charge transfer channel and said drain region, said region being a barrier against electrons; and
    (b) a drain electrode formed over said drain region, said drain electrode being electrically connected to said drain region.

4. A charge transfer apparatus according to claim 1, wherein:
    said charge transfer device has a structure capable of producing a plurality of charge transfer stages formed in one line, each of said charge transfer stages corresponding to associated one of said first charge transfer channel regions,
    each said charge transfer stage including only one first potential barrier region and only one first potential well region.

5. A charge transfer apparatus according to claim 1, said apparatus further having a structure capable of producing at least one charge transfer stage formed in each of connecting regions between each said first charge transfer channel region and said charge transfer device, wherein
each said charge transfer stage formed in said connecting region comprises one second potential barrier region and one second potential well region formed on the side of said second potential barrier region with facing said second charge transfer channel.

6. A charge transfer apparatus, comprising:
a semiconductor substrate;
a plurality of first charge transfer channel regions of a first conductivity type formed in one surface of the semiconductor substrate;
a charge transfer device including a first-conductivity-type second charge transfer channel, said second charge transfer channel being formed in said surface of the semiconductor substrate and being electrically connectable to each of said first transfer channel regions,
said charge transfer device having a plurality of charge transfer stages formed in one line in said second charge transfer channel, each of said charge transfer stages corresponding to associated one of said first charge transfer channel regions,
each said charge transfer stage including only one first potential barrier region and only one first potential well region; and
a discharge drain including a first-conductivity-type drain region formed in said surface of the semiconductor substrate along said second charge transfer channel, said drain region being electrically connectable to said second charge transfer channel.

7. A charge transfer apparatus according to claim 6, wherein said discharge drain further comprises:
(a) a second-conductivity-type gate region disposed between said second charge transfer channel and said drain region, said second conductivity type being opposite to said first conductivity type; and
(b) a discharge gate electrode formed on said gate region with an electrically insulating layer therebetween.

8. A charge transfer apparatus according to claim 6, wherein said discharge drain further comprises:
(a) a region formed between said second charge transfer channel and said drain region, said region being a barrier against electrons; and
(b) a drain electrode formed over said drain region, said drain electrode being electrically connected to said drain region.

9. A charge transfer apparatus according to claim 6, wherein said first potential barrier region has an effective impurity concentration lower than an effective impurity concentration of said first potential well region.

10. A charge transfer apparatus according to claim 6, said apparatus further having a line memory structure capable of producing at least one charge transfer stage formed in each of connecting regions between each said first charge transfer channel region and said charge transfer device, wherein
each said charge transfer stage formed in said connecting region comprises one second potential barrier region and one second potential well region, the second potential well region being formed on the side of said second potential barrier region which is facing said second charge transfer channel, the second potential barrier region forming a potential barrier for charge carriers in the second potential well region, the potential barrier being controllable relative to the first charge transfer channel region and the charge transfer device.

11. A driving method of a charge transfer apparatus comprising a semiconductor substrate; N first charge transfer channel regions of a first conductivity type formed in one surface of the semiconductor substrate; a charge transfer device including a first-conductivity-type second charge transfer channel, said second charge transfer channel being formed in said surface of the semiconductor substrate and being electrically connectable to each of said first transfer channel regions, said charge transfer device including at least N transfer electrodes formed on said second charge transfer channel with an electrically insulating layer therebetween, said at least N transfer electrodes respectively corresponding to said first charge transfer channel regions in a correspondence in which at least one said transfer electrode is disposed for each said first charge transfer channel region, said at least N transfer electrodes being classified into a plurality of groups of which each includes m successive transfer electrodes, m being a positive integer equal to or more than three, of said m successive transfer electrodes of a group of the plurality of groups being connected to respectively different voltage supply lines, corresponding transfer electrodes of the plurality of groups of m successive transfer electrodes being respectively connected to one identical voltage supply lines, and a discharge drain including a first-conductivity-type drain region formed in said surface of the semiconductor substrate along said second charge transfer channel, said drain region being electrically connectable to said second charge transfer channel, comprising the steps of:
(A) transferring charges from part of said N first charge transfer channel regions to said charge transfer device and discharging said charges from said charge transfer device to said discharge drain;
(B) transferring charges, to said charge transfer device, from said first charge transfer channel regions from which charges are not transferred to said charge transfer device in said step (A); and
(C) transferring charges transferred to said charge transfer device in said step (B) in a predetermined direction in said charge transfer device.

12. A driving method of a charge transfer apparatus according to claim 11, further comprising the step of (D) transferring charges causing a smear from said N first charge transfer channel regions to said charge transfer device and discharging said charges from said charge transfer device to said discharge drain.

13. A driving method of a charge transfer apparatus comprising a semiconductor substrate; a plurality of first charge transfer channel regions of a first conductivity type formed in one surface of the semiconductor substrate a charge transfer device including a first-conductivity-type second charge transfer channel, said second charge transfer channel being formed in said surface of the semiconductor substrate and being electrically connectable to each of said first transfer channel regions, said charge transfer device having a plurality of charge transfer stages formed in one line in said second charge transfer channel, each of said charge transfer stages corresponding to associated one of said first charge transfer channel regions, each said charge transfer stage including only one first potential barrier region and only one first potential well region; and a discharge drain including a first-conductivity-type drain region formed in said surface of the semiconductor substrate along said second charge transfer channel, said drain region being electrically connectable to said second charge transfer channel, comprising the steps of:
(A) transferring charges from part of said plurality of first charge transfer channel regions to said charge transfer device and discharging said charges from said charge transfer device to said discharge drain;

(B) transferring charges, to said charge transfer device, from said first charge transfer channel regions from which charges are not transferred to said charge transfer device in said step (A); and (C) transferring charges transferred to said charge transfer device in said step (B) in a predetermined direction in said charge transfer device.

14. A driving method of a charge transfer apparatus according to claim 13, further comprising the step of (D) transferring charges causing a smear from said plurality of first charge transfer channel regions to said charge transfer device and discharging said charges from said charge transfer device to said discharge drain.

15. A CCD image sensor, comprising:
a semiconductor substrate;
a large number of photoelectric converters formed in one surface of said semiconductor substrate in the form of a matrix including a plurality of rows and a plurality of columns;
a plurality of vertical charge transfer devices formed in said surface of the semiconductor substrate, said vertical charge transfer devices corresponding respectively to said photoelectric converter columns, each said vertical charge transfer device extending along said corresponding photoelectric converter column;
a CCD line memory section capable of producing at least one charge transfer stage formed for each said vertical charge transfer device at a position downstream said each vertical charge transfer device, each said charge transfer stage including a first-conductivity-type first charge transfer channel region continuous to said associated vertical charge transfer device;
a horizontal charge transfer device comprising a first-conductivity-type horizontal charge transfer channel formed in said surface of the semiconductor substrate with being electrically connected to each said first charge transfer channel regions, and a plurality of horizontal transfer electrodes formed over said horizontal charge transfer channel with an electrically insulating layer therebetween, each said horizontal charge transfer device having a plurality of charge transfer stages formed in said horizontal charge transfer channel, each of said charge transfer stages corresponding to an associated one of said vertical charge transfer devices, and having only one first potential barrier region and only one first potential well region; and
a discharge drain including a first-conductivity-type drain region formed in said surface of the semiconductor substrate along said horizontal charge transfer channel, said drain region being electrically connectable to said horizontal charge transfer channel.

16. A CCD image sensor according to claim 15, wherein said discharge drain further comprises:
(a) a second-conductivity-type gate region disposed between said horizontal charge transfer channel and said drain region, said second conductivity type being opposite to said first conductivity type; and
(b) a discharge gate electrode formed on said gate region with an electrically insulating layer therebetween.

17. A CCD image sensor according to claim 15, wherein said discharge drain further comprises:
(a) a region formed between said horizontal charge transfer channel and said drain region, said region being a barrier against electrons; and (b) a drain electrode formed over said drain region, said drain electrode being electrically connected to said drain region.

18. A CCD image sensor according to claim 15, wherein said horizontal charge transfer device includes at least N horizontal transfer electrodes, said at least N horizontal transfer electrodes respectively corresponding to said first charge transfer channel regions in a correspondence in which at least one said horizontal transfer electrode is disposed for each said first charge transfer channel region,
said at least N horizontal transfer electrodes being classified into a plurality of groups each including m successive horizontal transfer electrodes, m being a positive integer equal to or more than three,
each one of said m successive horizontal transfer electrodes of a group of the plurality of groups of m successive horizontal transfer electrodes being connected to a separate voltage supply line from the other successive horizontal transfer electrodes of the group,
corresponding successive horizontal transfer electrodes of the plurality of groups of m successive horizontal transfer electrodes being respectively connected to one identical voltage supply line.

19. A CCD image sensor according to claim 15, wherein each of said charge transfer stages of the CCD line memory section, comprises:
one second potential barrier region;
one second potential well region formed on the side of said second potential barrier region which faces said horizontal charge transfer channel; and
at least one transfer control electrode disposed over said second potential barrier region and said second potential well region.

20. A CCD image pickup system, comprising:
a CCD image sensor comprising a semiconductor substrate; a large number of photoelectric converters formed in one surface of said semiconductor substrate in the form of a matrix including a plurality of rows and a plurality of columns; a plurality of vertical charge transfer devices formed in said surface of the semiconductor substrate, said vertical charge transfer devices corresponding respectively to said photoelectric converter columns, each said vertical charge transfer device extending along said corresponding photoelectric converter column; a CCD line memory section capable of producing at least one charge transfer stage formed for each said vertical charge transfer device at a position downstream said each vertical charge transfer device, each said charge transfer stage including a first-conductivity-type first charge transfer channel region continuous to said associated vertical charge transfer device; a horizontal charge transfer device comprising a first-conductivity-type horizontal charge transfer channel formed in said surface of the semiconductor substrate with being electrically connected to each said first charge transfer channel regions, and a plurality of horizontal transfer electrodes formed over said horizontal charge transfer channel with an electrically insulating layer therebetween, each said horizontal charge transfer device having a plurality of charge transfer stages formed in said horizontal charge transfer channel, each of said charge transfer stages corresponding to an associated one of said vertical charge transfer devices, and having only one first potential barrier region and only one first potential well region; and a discharge drain including a first-conductivity-type drain region formed in said surface of the semiconductor substrate along said horizontal charge transfer channel, said drain region being electrically connectable to said horizontal charge transfer channel;

an output section disposed inside or outside said CCD image sensor for converting charges outputted from said horizontal charge transfer device into signal voltages;

a driving circuit for generating driving signals and/or control signals to be supplied to said vertical charge transfer devices, said CCD line memory section, and said horizontal charge transfer device; and a video signal proceeding circuit for generating image data using said signal voltages generated by said output section.

21. A CCD image pickup system according to claim 20, wherein said discharge drain further comprises:
   (a) a second-conductivity-type gate region disposed between said horizontal charge transfer channel and said drain region, said second conductivity type being opposite to said first conductivity type; and
   (b) a discharge gate electrode formed on said gate region with an electrically insulating layer therebetween.

22. A CCD image pickup system according to claim 20, wherein said discharge drain further comprises:
   (a) a region formed between said horizontal charge transfer channel and said drain region, said region being a barrier against electrons; and
   (b) a drain electrode formed over said drain region, said drain electrode being electrically connected to said drain region.

23. A CCD image pickup system according to claim 20, wherein said horizontal charge transfer device includes at least N horizontal transfer electrodes, said at least N horizontal transfer electrodes respectively corresponding to said first charge transfer channel regions in a correspondence in which at least one said horizontal transfer electrode is disposed for each said first charge transfer channel region, said at least N horizontal transfer electrodes being classified into a plurality of groups each including m successive horizontal transfer electrodes, m being a positive integer equal to or more than three, each one of said m successive horizontal transfer electrodes of a group of the plurality of groups of m successive horizontal transfer electrodes being connected to a separate voltage supply line from the other successive horizontal transfer electrodes of the group, corresponding successive horizontal transfer electrodes of the plurality of groups of m successive horizontal transfer electrodes being respectively connected to one identical voltage supply line.

24. A CCD image pickup device according to claim 20, wherein each of said charge transfer stages of the CCD line memory section comprises:

one second potential barrier region;

one second potential well region formed on the side of said second potential barrier region which faces said horizontal charge transfer channel; and at least one transfer control electrode disposed over said second potential barrier region and said second potential well region.

* * * * *